US010340418B2

(12) United States Patent
Kim et al.

(10) Patent No.: US 10,340,418 B2
(45) Date of Patent: Jul. 2, 2019

(54) ULTRAVIOLET LIGHT EMITTING DEVICE HAVING CURRENT BLOCKING LAYER

(71) Applicant: SEOUL VIOSYS CO., LTD., Ansan-si (KR)

(72) Inventors: Ye Seul Kim, Ansan-si (KR); Kyoung Wan Kim, Ansan-si (KR); Ji Hye Kim, Ansan-si (KR); Sang Won Woo, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/865,051

(22) Filed: Jan. 8, 2018

(65) Prior Publication Data

US 2018/0198023 A1 Jul. 12, 2018

(30) Foreign Application Priority Data

Jan. 6, 2017 (KR) .................. 10-2017-0002516

(51) Int. Cl.
*H01L 33/46* (2010.01)
*H01L 33/14* (2010.01)
(Continued)

(52) U.S. Cl.
CPC .............. *H01L 33/14* (2013.01); *H01L 33/20* (2013.01); *H01L 33/405* (2013.01); *H01L 33/46* (2013.01);
(Continued)

(58) Field of Classification Search
CPC ......... H01L 33/14; H01L 33/38; H01L 33/46; H01L 33/145; H01L 33/405
See application file for complete search history.

(56) References Cited

U.S. PATENT DOCUMENTS 8,969,901 B2 * 3/2015 Choi .................. H01L 33/405
257/98
2012/0043574 A1 * 2/2012 Lee .................... H01L 33/20
257/98
(Continued)

FOREIGN PATENT DOCUMENTS

JP 2015-060886 3/2015
WO 2016182248 A1 11/2016

OTHER PUBLICATIONS

Japanese Office Action from corresponding Japanese Application No. 2018-000589 dated Dec. 4, 2018 (3 pages).

*Primary Examiner* — Khiem D Nguyen
(74) *Attorney, Agent, or Firm* — Perkins Coie LLP

(57) ABSTRACT

Described herein is a highly efficient light emitting device. The light emitting device includes: a first conductivity-type semiconductor layer; a second conductivity-type semiconductor layer; an active layer interposed between the first conductivity-type semiconductor layer and the second conductivity-type semiconductor layer; a current blocking layer disposed on the second conductivity-type semiconductor layer; a transparent electrode layer covering the current blocking layer; a first electrode electrically connected to the first conductivity-type semiconductor layer; a second electrode disposed on the transparent electrode layer and electrically connected to the transparent electrode layer, the second electrode including a second electrode pad and a second electrode extension extending from the second electrode pad; and a second reflective layer interposed between the second electrode and the transparent electrode layer, wherein each of the second electrode pad and the second electrode extension covers at least part of the current blocking layer.

19 Claims, 10 Drawing Sheets

(51) Int. Cl.
  *H01L 33/40* (2010.01)
  *H01L 33/20* (2010.01)
  *H01L 33/38* (2010.01)
(52) U.S. Cl.
  CPC ...... *H01L 33/38* (2013.01); *H01L 2933/0016* (2013.01)

(56) References Cited

U.S. PATENT DOCUMENTS

| | | | |
|---|---|---|---|
| 2014/0361327 A1* | 12/2014 | Chae | H01L 33/22 257/98 |
| 2015/0076547 A1 | 3/2015 | Totani et al. | |
| 2015/0108520 A1* | 4/2015 | Kim | H01L 33/38 257/98 |
| 2016/0240744 A1 | 8/2016 | Huang et al. | |
| 2017/0125640 A1 | 5/2017 | Kim et al. | |
| 2017/0263816 A1* | 9/2017 | Yang | H01L 33/44 |

* cited by examiner

ULTRAVIOLET LIGHT EMITTING DEVICE HAVING CURRENT BLOCKING LAYER

CROSS-REFERENCE TO RELATED APPLICATION

This patent document claims the benefit and priority of Korean Patent Application No. 10-2017-0002516, filed on Jan. 6, 2017, which is hereby incorporated by reference for all purposes as if fully set forth herein.

TECHNICAL FIELD

Exemplary embodiments described in the present document relate to a light emitting device. Some implementations of the disclosed technology are directed to a light emitting device including a current blocking layer.

BACKGROUND

A light emitting device emits light through recombination of electrons and holes. The light emitting device generally includes an n-type semiconductor layer, an active layer, a p-type semiconductor layer, and a pad electrode for receiving electric power, and employs a transparent electrode and/or an electrode extension to aid in current spreading in the semiconductor layers. Furthermore, a current blocking layer (CBL) may be disposed under the pad electrode or the electrode extension extending from the pad electrode to aid in horizontal current spreading.

SUMMARY

Exemplary embodiments disclosed in the present document provide a light emitting device capable of preventing a current blocking layer from being peeled off.

Exemplary embodiments disclosed in the present document provide a light emitting device capable of supplementing reflection performance of the current blocking.

Exemplary embodiments disclosed in the present document provide a light emitting device suppressing light absorption by electrodes to improve light extraction efficiency.

Exemplary embodiments disclosed in the present document provide a light emitting device including a distributed Bragg reflector with an improved structure.

In accordance with one exemplary embodiment of the present document, a light emitting device includes: a first conductivity-type semiconductor layer; a second conductivity-type semiconductor layer; an active layer interposed between the first conductivity-type semiconductor layer and the second conductivity-type semiconductor layer; a current blocking layer disposed on the second conductivity-type semiconductor layer; a transparent electrode layer covering the current blocking layer; a first electrode electrically connected to the first conductivity-type semiconductor layer; a second electrode disposed on the transparent electrode layer and electrically connected to the transparent electrode layer, the second electrode including a second electrode pad and a second electrode extension extending from the second electrode pad; and a second reflective layer interposed between the second electrode and the transparent electrode layer, wherein each of the second electrode pad and the second electrode extension covers at least part of the current blocking layer.

Exemplary embodiments described in the present document provide a light emitting device that prevents a current blocking layer from being peeled off to improve reliability and further includes a reflective layer for reducing light absorption by an electrode to improve light extraction efficiency.

DETAILED DESCRIPTION

Figure 1:
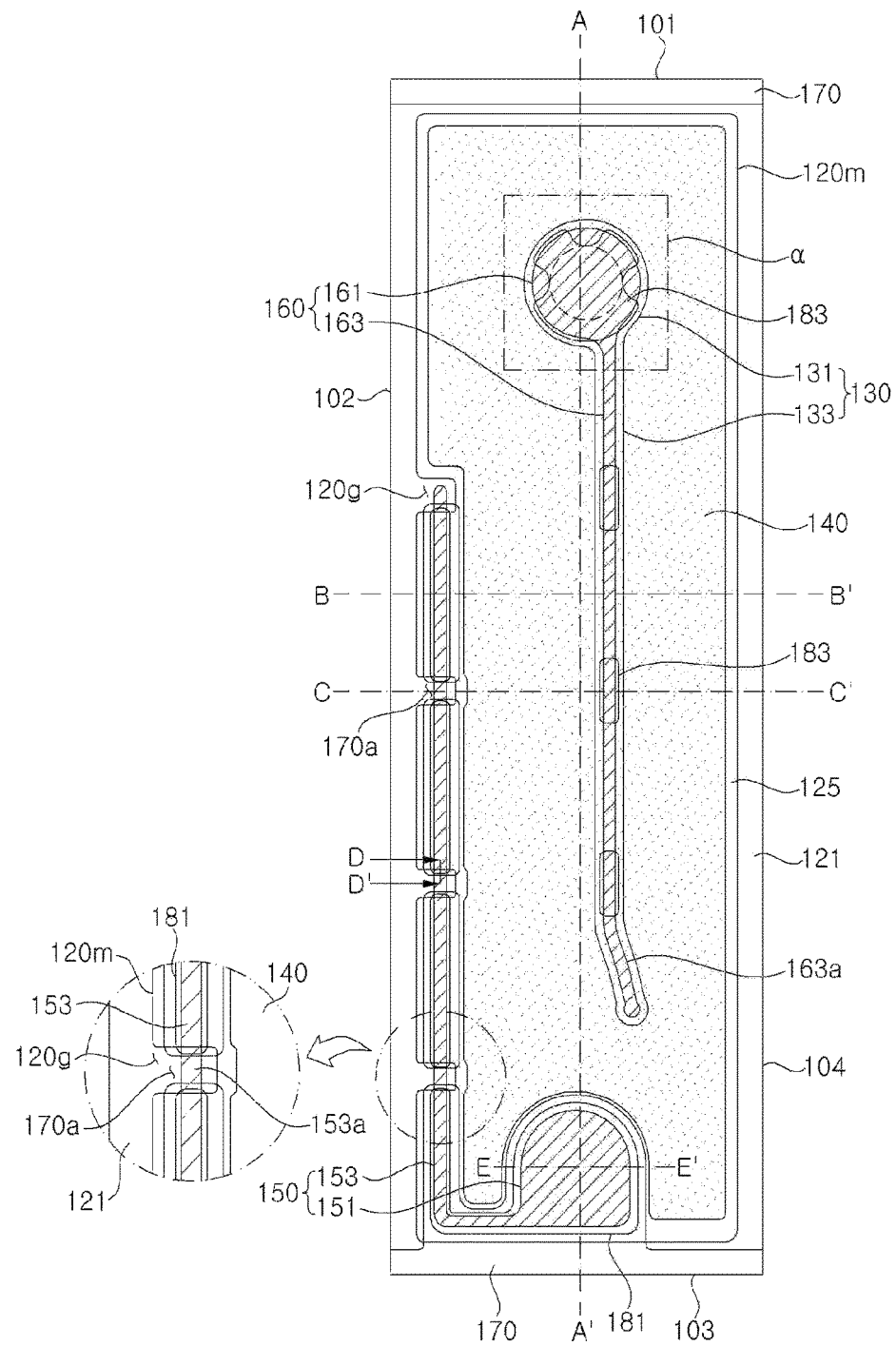
FIG. 1 is a plan view of an exemplary light emitting device according to one exemplary embodiment of the present document.

Hereinafter, exemplary embodiments described in the present document will be described in detail with reference to the accompanying drawings. The present document is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

A light emitting device is structured so that the photons generated from the device are emitted with light output. In the light emitting device, a fraction of light generated from an active layer and traveling towards a pad electrode or an electrode extension may be absorbed by the pad electrode and/or the electrode extension. The absorption of the light in the pad electrode and/or the electrode extension may affect the performance of the light emitting device by reducing light output. In order to reduce or prevent undesired absorption of the light, a current blocking layer may include a distributed Bragg reflector (DBR) including a plurality of dielectric layers to reflect light traveling towards the pad electrode and the electrode extension.

The light emitting device also includes a transparent electrode formed on the p-type semiconductor layer. In order to reduce contact resistance between the transparent electrode and the semiconductor layers, a material layer for the transparent electrode is deposited and subjected to rapid thermal annealing. Since the current blocking layer is generally placed under the transparent electrode, the current blocking layer may be exposed to high temperature during the annealing process of the transparent electrode. When the current blocking layer is exposed to high temperature, stress can be applied to the current blocking layer. For example, when the current blocking layer includes a plurality of layers such as a distributed Bragg reflector, stress can be applied to the current blocking layer by rapid thermal annealing, thereby causing peeling of the current blocking layer.

In accordance with one exemplary embodiment of the present document, a light emitting device includes: a first conductivity-type semiconductor layer; a second conductivity-type semiconductor layer; an active layer interposed between the first conductivity-type semiconductor layer and the second conductivity-type semiconductor layer; a current blocking layer disposed on the second conductivity-type semiconductor layer; a transparent electrode layer covering the current blocking layer; a first electrode electrically connected to the first conductivity-type semiconductor layer; a second electrode disposed on the transparent electrode layer and electrically connected to the transparent electrode layer, the second electrode including a second electrode pad and a second electrode extension extending from the second electrode pad; and a second reflective layer interposed between the second electrode and the transparent electrode layer, wherein each of the second electrode pad and the second electrode extension covers at least part of the current blocking layer.

In some implementations, the second reflective layer may include dielectric layers having different indices of refraction and the second electrode may be confined within an upper region of the current blocking layer. In some implementations, the current blocking layer may include a first current blocking layer corresponding to the second electrode pad and a second current blocking layer corresponding to the second electrode extension. In some implementations, the second reflective layer may include a reflective layer interposed between the second electrode pad and the first current blocking layer and having at least one recess. In some implementations, the recess may be placed in the upper region of the current blocking layer and at least part of a lower surface of the second electrode pad may be connected to the transparent electrode layer through the at least one recess of the reflective layer. In some implementations, the second reflective layer may include a reflective layer disposed in the form of dots between the second electrode extension and the transparent electrode layer, in which the reflective layer has a greater width than the second electrode extension. In addition, the reflective layer disposed in the form of dots may be confined within an upper region of the current blocking layer. In some implementations, the light emitting device may further include an insulating layer disposed under the first electrode; and a first reflective layer interposed between the first electrode and the insulating layer. In some implementations, the first electrode may include a first electrode pad and a first electrode extension extending from the first electrode pad. The first electrode pad may be disposed above the second conductivity-type semiconductor layer and the insulating layer may insulate the first electrode pad from the second conductivity-type semiconductor layer. In some implementations, the first reflective layer may include a reflective layer disposed between the first electrode pad and the second conductivity-type semiconductor layer and having an area smaller than the first electrode pad and larger than the first electrode pad. In some implementations, the first reflective layer may include a reflective layer disposed in the form of dots under the first electrode extension, and the reflective layer may have a greater width than the first electrode extension. In some implementations, the second reflective layer may include a reflective layer disposed in the form of dots between the second electrode extension and the transparent electrode layer, and the reflective layer has a greater width than the second electrode extension. Here, the dots of the second reflective layer and the dots of the first reflective layer may be alternately arranged. In some implementations, the first electrode may include a first electrode pad and a first electrode extension extending from the first electrode pad. The first electrode pad may be disposed above the first conductivity-type semiconductor layer, and the insulating layer may have a smaller area than the first electrode pad, and may be disposed in some region between the first electrode pad and the first conductivity-type semiconductor layer. In some implementations, an area of the insulating layer interposed between the first electrode pad and the first conductivity-type semiconductor layer may be less than 90% of an area of the first electrode pad. In some implementations, the light emitting device may further include a mesa disposed on the first conductivity-type semiconductor layer and including the active layer and the second conductivity-type semiconductor layer, wherein the mesa includes at least one groove formed on a side surface thereof such that the first conductivity-type semiconductor layer is partially exposed through the groove, the insulating layer includes an opening at least partially exposing the exposed first conductivity-type semiconductor layer, and the first electrode extension may be connected to the first conductivity-type semiconductor layer through the opening. In some implementations, the second reflective layer may include a reflective layer disposed in the form of dots between the second electrode extension and the transparent electrode layer. Here, the reflective layer may have a greater width than the second electrode extension and the dots of the second reflective layer and the at least one groove of the mesa may be alternately arranged. In some implementations, the current blocking layer may be composed of a single layer and the reflective layer may include a plurality of layers having different indices of refraction. In some implementations, the reflective layer may include a first region and a second region, wherein the first region may be a single layer placed at the lowermost side of the reflective layer and the second region may include a plurality of layers placed on the first region. Here, the first region may have a thickness of $7/(4*n1)*\lambda$ and each of the layers in the second region may have a thickness of $1/(4*n2)*\lambda$. Here, $\lambda$ is the wavelength of light generated from the active layer, $n1$ is the index of refraction of the first region, and $n2$ is the index of refraction of each of the layers in the second region.

Hereinafter, exemplary embodiments described in the present document will be described in detail with reference to the accompanying drawings.

FIG. 1 is a plan view of an exemplary light emitting device according to one exemplary embodiment of the present document and FIG. 2 to FIG. 6 are cross-sectional views taken along lines A-A', B-B', C-C', D-D' and E-E' of FIG. 1, respectively. FIG. 7A is an enlarged plan view illustrating a second electrode, a transparent electrode, a reflective layer and an insulating layer, and FIG. 7B and FIG. 7C are cross-sectional views taken along lines F-F' and G-G' of FIG. 7A, respectively.

Referring to FIG. 1 to FIG. 7, the light emitting device includes a light emitting structure 120, a current blocking layer 130, a transparent electrode layer 140, a first electrode 150, and a second electrode 160. In addition, the light emitting device may further include a substrate 110, an insulating layer 170, an upper reflective layer 180, and a lower reflective layer 190. As shown in FIGS. 1-4, the light emitting device may include first to fourth sides 101, 102, 103, 104, the first and third sides 101 and 103 parallel to each other and the second and fourth sides 102 and 104 parallel to each other. Each of the second and fourth sides 102 and 104 connects the first side 101 to the third side 103. In some implementations, the first side 101 is substantially perpendicular to the second and fourth sides 102 and 104. The light emitting device may have a rectangular shape with different aspect ratios, without being limited thereto.

The substrate 110 may be an insulating or conductive substrate. In addition, the substrate 110 may be a growth substrate for growing the light emitting structure 120, and may include a sapphire substrate, a silicon carbide substrate, a silicon substrate, a gallium nitride substrate, an aluminum nitride substrate, or others. Alternatively, the substrate 110 may be a secondary substrate for supporting the light emitting structure 120. The substrate 110 may be a patterned sapphire substrate (PSS) having a patterned upper surface. When the substrate 110 is a patterned sapphire substrate, the substrate 110 may include a plurality of protrusions (not shown) on the upper surface thereof.

Although a first conductivity-type semiconductor layer 121 is described as being disposed on the substrate 110 in this exemplary embodiment, when the substrate 110 is a growth substrate capable of growing semiconductor layers 121, 123, 125 thereon, the substrate 110 may be separated and removed by physical and/or chemical methods after growth of the semiconductor layers 121, 123, 125 thereon.

The light emitting structure 120 may include a first conductivity-type semiconductor layer 121, a second conductivity-type semiconductor layer 125 disposed on the first conductivity-type semiconductor layer 121, and an active layer 123 interposed between the first conductivity-type semiconductor layer 121 and the second conductivity-type semiconductor layer 125. In addition, the light emitting structure 120 may include a mesa 120m disposed on the first conductivity-type semiconductor layer 121 and including the active layer 123 and the second conductivity-type semiconductor layer 125.

The first conductivity-type semiconductor layer 121, the active layer 123 and the second conductivity-type semiconductor layer 125 may be grown on the substrate 110 in a chamber using a suitable method such as MOCVD. In addition, the first conductivity-type semiconductor layer 121, the active layer 123 and the second conductivity-type semiconductor layer 125 may include Group III-V based nitride semiconductors, for example, nitride semiconductors such as (Al, Ga, In)N. The first conductivity-type semiconductor layer 121 may include n-type dopants (for example, Si, Ge, or Sn) and the second conductivity-type semiconductor layer 125 may include p-type dopants (for example, Mg, Sr, or Ba), or vice versa. In this exemplary embodiment, the second conductivity-type semiconductor layer 125 is a p-type semiconductor layer. The active layer 123 may include a multiple quantum well (MQW) structure and the composition ratio of the nitride-based semiconductors may be adjusted to emit light having a desired wavelength.

The mesa 120m is disposed in some regions of the first conductivity-type semiconductor layer 121 such that the surface of the first conductivity-type semiconductor layer 121 can be exposed around the mesa 120m. When the mesa 120 is disposed in some regions of the first conductivity-type semiconductor layer 121, the first conductivity-type semiconductor layer 121 is exposed in the region where the mesa 120m is not formed. The mesa 120m may be formed by partially etching the second conductivity-type semiconductor layer 125 and the active layer 123. The mesa 120m may be formed, for example, along the sides of the first conductivity-type semiconductor layer 121, as shown in FIG. 1, without being limited thereto. The mesa 120m may have an inclined side surface, or may have a side surface perpendicular to an upper surface of the first conductivity-type semiconductor layer 121.

Further, in this exemplary embodiment, the mesa 120m may include at least one groove 120g indented or depressed from a side surface thereof. Referring to FIG. 1, the groove 120g may expose the first conductivity-type semiconductor layer 121. The groove 120g may be formed along at least one side of the light emitting device and may be formed in plural along, for example, the second side 102 of the light emitting device, as shown in FIG. 1. In some implementations, a plurality of grooves 120g may be arranged substantially at the same intervals. With the grooves 120g, the mesa 120m may have different portions with different width from each other along a direction parallel to the first side 101 or the third side 103.

The current blocking layer 130 is at least partially disposed on the second conductivity-type semiconductor layer 125. The current blocking layer 130 may be disposed on the second conductivity-type semiconductor layer 125 corresponding to the location of the second electrode 160. The current blocking layer 130 may include a first current blocking layer 131 and a second current blocking layer 133. The first current blocking layer 131 and the second current blocking layer 133 may be disposed corresponding to a second electrode pad 161 and a second electrode extension 163, respectively. Thus, as shown in the drawings, the first current blocking layer 131 may be disposed near the first side 101 of the light emitting device and the second current blocking layer 133 may extend from the first side 101 towards the third side 103. The first current blocking layer 131 may be disposed closer to the first side 101 of the light emitting device than the second current blocking layer 133 is. The first current blocking layer 131 may be disposed closer to the first side 101 of the light emitting device than the third side 103 of the light emitting device.

The current blocking layer 130 can prevent electric current supplied to the second electrode 160 from being directly transmitted to the semiconductor layer, thereby preventing current crowding in the semiconductor layer under the second electrode 160. Thus, the current blocking layer 130 may have insulating properties and may include an insulating material. The current blocking layer 130 may include a single layer and may include SiOx or SiNx.

The current blocking layer 130 may have a larger area than the second electrode 160 formed on the current blocking layer 130. Thus, the second electrode 160 may be confined within an upper region of the current blocking layer 130. In some implementations, the current blocking layer 130 may have an inclined side surface. With this structure, it is possible to prevent separation of the transparent electrode layer 140 or electrical disconnection at a corner (for example, angled portion) of the current blocking layer 130.

The transparent electrode layer 140 may be disposed on the second conductivity-type semiconductor layer 125 and may cover a portion of an upper surface of the second conductivity-type semiconductor layer 125 and a portion of the current blocking layer 130. The transparent electrode layer 140 may include an opening 140a that partially exposes the first current blocking layer 131. The opening 140a may be disposed on the first current blocking layer 131 and the transparent electrode layer 140 may partially cover the first current blocking layer 131. In some implementations, the opening 140*a* may be confined to a region on the first current blocking layer 131 and may be formed in a substantially similar shape to the first current blocking layer 131.

The transparent electrode layer 140 may include a material having light transmittance and electrical conductivity such as a conductive oxide or a light transmitting metal layer. For example, the transparent electrode layer 140 may include at least one of indium tin oxide (ITO), zinc oxide (ZnO), zinc indium tin oxide (ZITO), zinc indium oxide (ZIO), zinc tin oxide (ZTO), gallium indium tin oxide (GITO), gallium indium oxide (GIO), gallium zinc oxide (GZO), aluminum doped zinc oxide (AZO), fluorine tin oxide (FTO), or a Ni/Au stacked structure. In addition, the transparent electrode layer 140 may form ohmic contact with the second conductivity-type semiconductor layer 125. In this exemplary embodiment, the second electrode 160 does not directly contact the second conductivity-type semiconductor layer 125, thereby enabling more efficient current spreading through the transparent electrode layer 140.

In addition, the transparent electrode layer 140 may include a concave portion formed around the groove 120*g* of the mesa 120*m*. As shown in an enlarged view of FIG. 1, the concave portion of the transparent electrode layer 140 may be formed along the groove 120*g* of the mesa 120*m*. With the structure of the concave portion, the transparent electrode layer 140 may be formed to have a peripheral line formed along the peripheral line of the mesa 120*m*. The concave portion can prevent electric short due to formation of the transparent electrode layer 140 on a side surface of the groove 120*g* during manufacture of the light emitting device.

Referring to FIG. 1 to FIG. 6, the current blocking layer 130 is disposed in some regions under the transparent electrode layer 140. In the course of forming the transparent electrode layer 140, heat treatment is performed in order to reduce contact resistance of the transparent electrode layer 140 which is formed on the second conductivity-type semiconductor layer 125. For example, rapid thermal annealing (RTA) may be performed. During RTA, heat is applied not only to the transparent electrode layer 140 but also to the current blocking layer 130 disposed under the transparent electrode layer 140.

A distributed Bragg reflector has been used for the current blocking layer 130 to prevent light absorption. The current blocking layer 130 composed of a distributed Bragg reflector having a multilayer structure, however, caused some stress due to crystallization or difference in coefficient of thermal expansion between layers constituting the current blocking layer 130, thereby causing the current blocking layer 130 to peel off.

For example, assuming that the current blocking layer 130 includes a distributed Bragg reflector in which SiO2 and TiO2 layers are alternately stacked one above another. In this structure, when heat is applied to the transparent electrode layer 140 during the RTA process, the TiO2 layer disposed under the transparent electrode layer 140 and relatively vulnerable to heat is also exposed to high temperature and can be crystallized. Since crystallization of the TiO2 layer occurs at about 300 to 350 degrees Celsius and the RTA process is performed at a high temperature of 600 degrees Celsius or higher, crystallization occurs in the current blocking layer 130, for example, in the TiO2 layer, which is formed prior to the transparent electrode layer 140 and disposed under the transparent electrode layer 140.

Crystallization of the TiO2 layer can cause reduction in volume thereof. When the volume of the TiO2 layer is reduced in the distributed Bragg reflector in which the SiO2 layers and the TiO2 layers are alternately stacked one above another, stress is induced in the SiO2 layers and TiO2 layers, thereby causing delamination at an interface therebetween.

Since the first current blocking layer 131 formed under the second electrode pad 161 has a relatively wide area, the SiO2 layer and the TiO2 layer are separated from each other in a portion of the first current blocking layer 131, thereby causing undesired effects, for example, a ball-up phenomenon. On the other hand, like the second current blocking layer 133 formed under the second electrode extension 163, a relatively narrow portion of the current blocking layer can be partially torn away when the SiO2 layer and the TiO2 layer are separated from each other.

According to this exemplary embodiment, the current blocking layer 130 includes a single layer of SiOx or SiNx in order to prevent crystallization during the RTA process. Since the current blocking layer 130 includes the single layer, the separation between the layers can be avoided. Accordingly, unlike the conventional current blocking layer, the current blocking layer 130 according to this exemplary embodiment does not suffer from peeling off during subsequent annealing treatment.

The first electrode 150 is electrically connected to the first conductivity-type semiconductor layer 121. The first electrode 150 may be electrically connected to the first conductivity-type semiconductor layer 121 through ohmic contact with an upper surface of the first conductivity-type semiconductor layer 121 exposed by partially removing the second conductivity-type semiconductor layer 125 and the active layer 123. The first electrode 150 may include a first electrode pad 151 and a first electrode extension 153. The first electrode extension 153 includes at least one extension contact portion 153*a*. The extension contact portion 153*a* may form ohmic contact with the first conductivity-type semiconductor layer 121.

In this exemplary embodiment, the first electrode pad 151 and a portion of the first electrode extension 153 may be disposed on the mesa 120*m*. The first electrode 150 may serve to supply external power to the first conductivity-type semiconductor layer 121. The first electrode 150 may include a metallic material such as Ti, Pt, Au, Cr, Ni, Al, or others. In addition, the first electrode 150 may be composed of a single layer or multiple layers.

The first electrode pad 151 may be disposed near the third side 103 of the light emitting device and the first electrode extension 153 may extend towards the first side 101 along the third side 103 and the second side 102. In general, for the light emitting device having a rectangular shape with different aspect ratios, the first electrode pad 151 is formed in a corner region of the light emitting device. However, in the structure wherein the first electrode pad 151 is formed in the corner region of the light emitting device, a lead frame can be partially damaged upon ball bonding or wire bonding. Thus, as in this exemplary embodiment, the first electrode pad 151 may be formed in a central region of the light emitting structure 120 between the second and the fourth sides 102 and 104. In some implementations, the first electrode pad 151 has a symmetric geometry about the longitudinal center of the light emitting device and the geometric center of the first electrode pad 151 coincides with the longitudinal center of the light emitting device. Accordingly, it is possible to improve efficiency in bonding and packaging.

The first electrode pad 151 may be spaced apart from an outer side of the light emitting structure 120 by a predetermined distance in order to improve process efficiency by securing a suitable level of process margin upon packaging.

The second electrode 160 is disposed on the second conductivity-type semiconductor layer 125 and at least part of the second electrode 160 is disposed on a region in which the current blocking layer 130 is disposed. The second electrode 160 includes the second electrode pad 161 and the second electrode extension 163, which may be disposed on the first current blocking layer 131 and the second current blocking layer 133, respectively. In addition, a portion of the transparent electrode layer 140 may be interposed between the second electrode 160 and the current blocking layer 130. The second electrode pad 161 may be disposed on the opening 140a of the transparent electrode layer 140. In this exemplary embodiment, since the current blocking layer 130 is a single layer comprising SiOx or SiNx, its reflectivity of light generated from the active layer 123 and traveling towards the second electrode 160 may be less as compared to the current blocking layer having the distributed Bragg reflector. Thus, the light emitting device may further include a separate upper reflective layer 180 in order to supplement the current blocking layer, as described later.

The second electrode pad 161 may partially adjoin the transparent electrode layer 140. Although not particularly limited, the location of the second electrode pad 161 may be determined so as to allow light to be emitted through the entire surface of the active layer 123 of the light emitting device through efficient current spreading. For example, as shown in the drawings, the second electrode pad 161 may be disposed near the first side 101 opposite to the third side 103, to which the first electrode pad 151 is disposed adjacent. The shape of the second electrode pad 161 will be described below with reference to FIG. 6.

The second electrode extension 163 extends from the second electrode pad 161. In this exemplary embodiment, the second electrode extension 163 may extend from the second electrode pad 161 towards the third side 103. In addition, the extension direction of the second electrode extension 163 may be changed. For example, a distal end 163a of the second electrode extension 163 may be bent towards a portion between the third side 103 and the fourth side 104 of the light emitting device. For example, the distal end 163 of the second electrode extension 163 is located closer to the fourth side 104 than the remaining portion of the second electrode extension 163 is. The distal end 163 of the second electrode extension 163 may be spaced apart from the first electrode pad 151 by a constant distance. This structure can prevent current crowding at the distal end of the second electrode extension 163. This structure can be designed in various ways in consideration of the distance between the first electrode pad 151 and the second electrode extension 163. The transparent electrode layer 140 is interposed between the second electrode extension 163 and the second current blocking layer 133, whereby the second electrode extension 163 is electrically connected to the transparent electrode layer 140 while contacting the transparent electrode layer 140.

The distal end of the second electrode extension 163 may include a portion having a greater width than an average width of the second electrode extension 163. For example, the distal end of the second electrode extension 163 may be formed in a circular shape having a greater diameter than the width of the second electrode extension 163, without being limited thereto. Alternatively, the distal end of the second electrode extension 163 may be modified into various shapes including a polygonal shape, an elliptical shape, an arcuate shape, or others.

The arrangement of the second electrode 160 is not limited thereto and may be modified and changed in various ways depending upon the shape of the light emitting device.

The second electrode 160 may include a metallic material such as Ti, Pt, Au, Cr, Ni, and Al, and may include a single layer or multiple layers. For example, the second electrode 160 may include at least one of metal stack structures including Ti/Au layers, Ti/Pt/Au layers, Cr/Au layers, Cr/Pt/Au layers, Ni/Au layers, Ni/Pt/Au layers, Cr/Al/Ti/Cr/Au layers, or Cr/Al/Cr/Ni/Au layers.

The arrangement of the first electrode 150 and the second electrode 160 is not limited thereto and may be modified and changed in various ways depending upon the shape of the light emitting device and current applied thereto. The arrangement of the first electrode pad 151 and the first electrode extension 153 may be changed in relation to the arrangement of the second electrode pad 161 and the first electrode extension 153.

The insulating layer 170 may be disposed between the light emitting structure 120 and the first electrode 150. At least part of the first electrode 150 is formed on the second conductivity-type semiconductor layer 125 and the insulating layer 170 is interposed between the second conductivity-type semiconductor layer 125 and the first electrode 150 to insulate the first electrode 150 from the second conductivity-type semiconductor layer 125.

The insulating layer 170 may be formed by the same process as the current blocking layer 130. For example, the insulating layer 170 may be formed of the same material as the current blocking layer 130. For example, the insulating layer 170 may be composed of or include a single layer comprising SiOx or SiNx.

Figure 2:
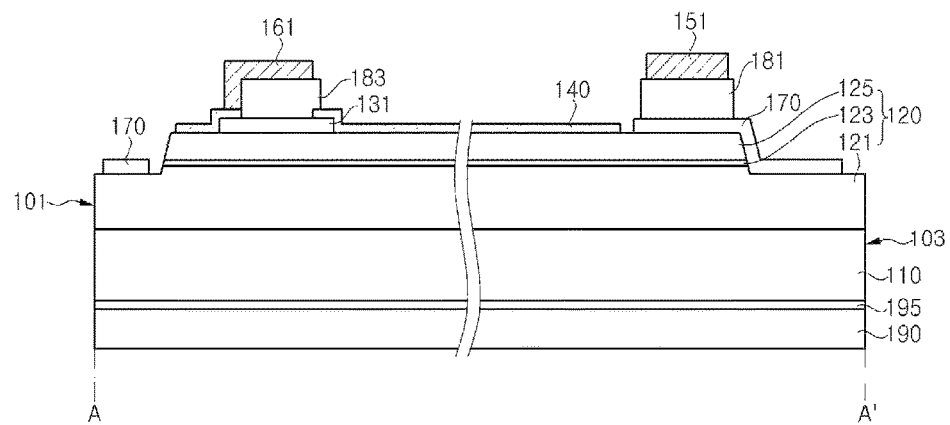
FIG. 2 to FIG. 6 are cross-sectional views taken along lines A-A', B-B', C-C', D-D' and E-E' of FIG. 1, respectively.
Figure 3:
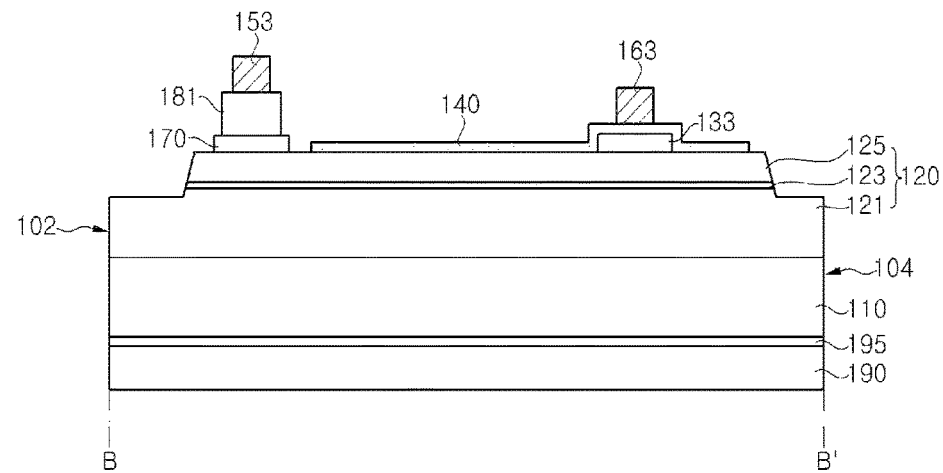

As shown in FIG. 1 and FIG. 2, the insulating layer 170 is disposed below the first electrode pad 151 and electrically insulates the first electrode pad 151 from the second conductivity-type semiconductor layer 125. Referring to FIG. 2, the insulating layer 170 disposed below the first electrode pad 151 extends towards the third side 103 of the light emitting device to cover the side surface of the light emitting structure 120 and at least part of the first conductivity-type semiconductor layer 121 exposed through mesa etching. As a result, an electrical short circuit between the first electrode pad 151 and the second conductivity-type semiconductor layer 125 can be avoided. For example, electrical short circuit can be prevented by applying wire bonding to the first electrode pad 151.

Referring to FIG. 1, particularly, an enlarged view of FIG. 1, the insulating layer 170 may be disposed under the first electrode extension 153 and may include an opening 170a that partially exposes the first conductivity-type semiconductor layer 121 exposed through the groove 120g of the mesa 120m. The extension contact portion 153a of the first electrode extension 153 is disposed on the first conductivity-type semiconductor layer 121 exposed through the opening 170a to be electrically connected to the first conductivity-type semiconductor layer 121. Further, the insulating layer 170 partially covers the side surface of the groove 120g to prevent electrical short circuit due to contact between the first electrode extension 153 and the side surface of the light emitting structure 120.

Referring to FIG. 2, the insulating layer 170 near the first side 101 of the light emitting device may be placed on the exposed portion of first conductivity-type semiconductor layer 121, which is exposed by mesa etching. Accordingly, it is possible to prevent electrical connection between a wire and the first conductivity-type semiconductor layer 121 upon wire bonding to the second electrode pad 161.

Although the insulating layer 170 near the first side 101 of the light emitting device is illustrated as being placed only on the first conductivity-type semiconductor layer 121, the insulating layer 170 may further extend to cover the side surface of the light emitting structure 120. With this structure, the insulating layer 170 can prevent electrical connection to the active layer 123.

Figure 8:
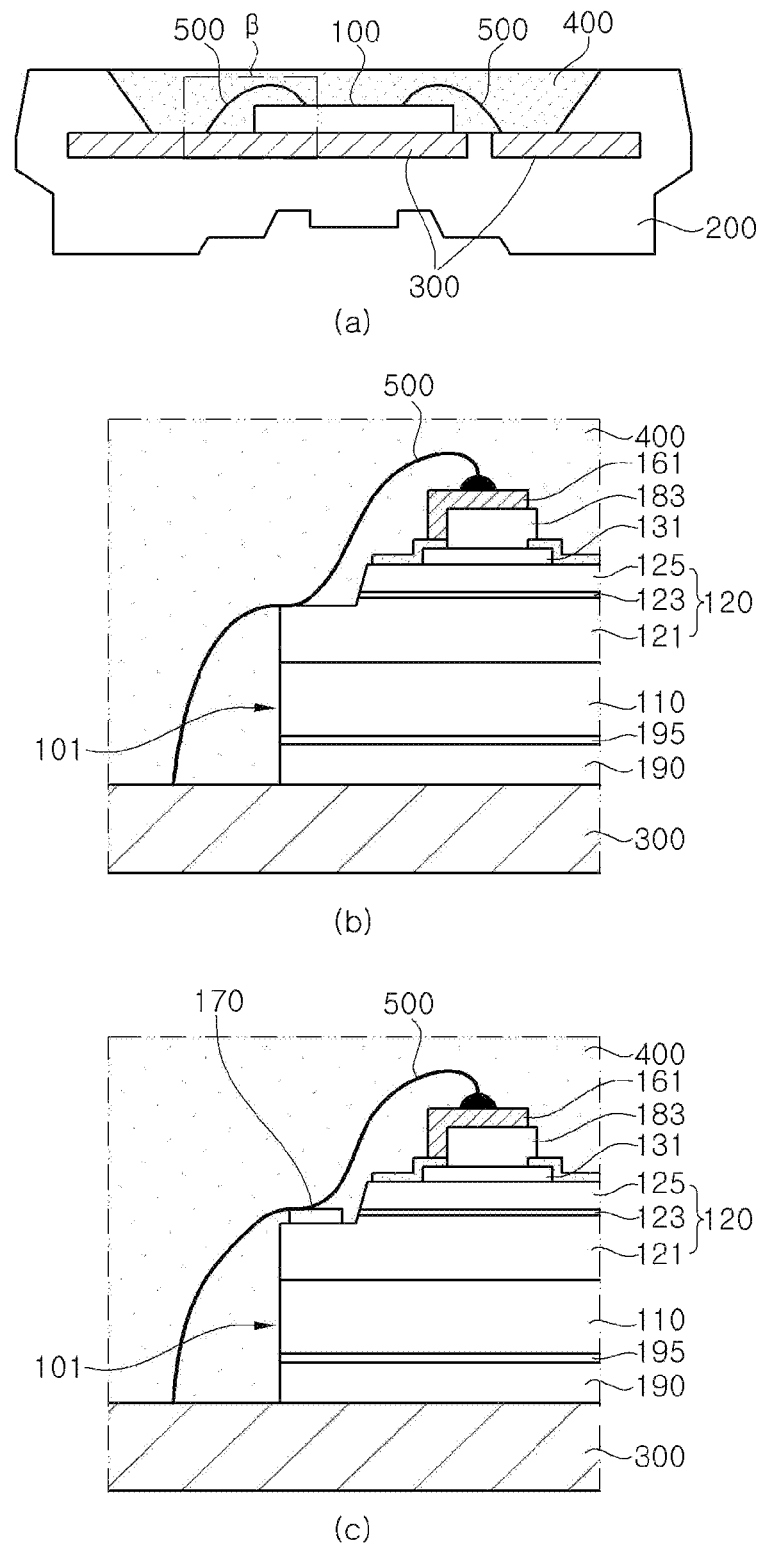
FIG. 8 shows a package of an exemplary light emitting device according to an exemplary embodiment of the present document.

FIG. 8 shows a light emitting device package to which the light emitting device is applied. Specifically, FIG. 8A is a cross-sectional view of a light emitting device package according to this exemplary embodiment, and FIG. 8B and FIG. 8C are enlarged views of Region β of FIG. 8A. FIGS. 8A to 8C explain effects of the insulating layer 170 which is placed on the exposed region of the first conductivity-type semiconductor layer 121 near the first side 101.

Referring to FIG. 8, the light emitting device package includes a light emitting device 100, a housing 200 including a cavity for mounting the light emitting device 100, lead terminals 300 on which the light emitting device 100 is mounted, a molding part 400 that protects the light emitting device 100 and may include phosphors (not shown), and a wire 500 that electrically connects the light emitting device 100 to the lead terminals 300.

The light emitting device 100 may include the light emitting device as shown in FIG. 1. In some implementations, the light emitting device 100 as shown in FIG. 8 may include a light emitting device with different structures from FIG. 1. For example, the light emitting device described below with reference to FIG. 9 can be used for the light emitting device package in FIG. 8. The light emitting device 100 includes a first electrode 150 and a second electrode 160, which may be electrically connected to the lead terminals 300 through wires 500 by wire bonding.

FIG. 8B and FIG. 8C are included to explain effects of the insulating layer 170 which is interposed between the second electrode pad 161 and the first side 101 of the light emitting device 100. FIG. 8B shows the structure wherein the insulating layer 170 is not present and FIG. 8C shows the structure wherein the insulating layer 170 is interposed between the second electrode pad 161 and the first side 101 of the light emitting device 100.

First, referring to FIG. 8B, when the wire 500 bonded to the second electrode pad 161 extends to be connected to the lead terminal 300, various factors such as a failure or external impact can make a portion of the wire be located closer to the first conductivity-type semiconductor layer 121 than the rest portion of the wire is. The portion of the wire located closer to the first conductivity-type semiconductor layer 121 can be bent toward the first conductivity-type semiconductor layer 121 and thus electrically connected to the light emitting device 100. As shown in FIG. 8B, when the wire 500 is bonded to the second electrode pad 161 electrically connected to the second conductivity-type semiconductor layer 125 and one surface of the light emitting device 100 to which the wire 500 is connected is electrically connected to the first conductivity-type semiconductor layer 121, there can be a significant problem in reliability of the light emitting device package.

Here, referring to FIG. 8c, the light emitting device 100 according to this exemplary embodiment includes the insulating layer 170 disposed on the first conductivity-type semiconductor layer 121 exposed between the second electrode pad 161 and the first side 101 of the light emitting device 100. With this structure, the insulating layer 170 can prevent the wires 500 from being electrically connected to the first conductivity-type semiconductor layer 121 even in the case where the wires 500 are bent toward the first conductivity-type semiconductor layer 121 by a number of factors. Accordingly, the insulating layer 170 prevents the wires 500 from being electrically connected to the first conductivity-type semiconductor layer 121 and the second conductivity-type semiconductor layer 125 at the same time. Thus, reliability of the light emitting device package can be maintained by the insulating layer 170.

Such an effect can also be expected from the structure of the insulating layer 170 extending from a lower side of the first electrode pad 151 towards the third side 103 to cover the side surface of the light emitting structure 120 and at least part of the first conductivity-type semiconductor layer 121 exposed by mesa etching.

Referring again to FIG. 1 to FIG. 7, the upper reflective layer 180 is at least partially placed under the first electrode 150 and the second electrode 160. The upper reflective layer 180 includes a first reflective layer 181, which is disposed on the insulating layer 170 corresponding to the location of the first electrode 150, and a second reflective layer 183, which is disposed on the current blocking layer 130 corresponding to the location of the second electrode 160. The upper reflective layer 180 can improve light extraction efficiency of the light emitting device by supplementing the insulating layer 170 and the current blocking layer 130 including a single layer comprising SiOx or SiNx.

As described above, in order to prevent the current blocking layer 130 from being peeled off in the RTA process for the transparent electrode layer 140, the light emitting device according to this exemplary embodiment includes the current blocking layer 130 including a single layer comprising SiOx or SiNx. Although the current blocking layer 130 including a single layer has benefits of avoiding peeling off in the RTA process for the transparent electrode layer 140, the current blocking layer 130 including a single layer has lower reflectivity than a DBR layer including multiple layers. Accordingly, the current blocking layer 130 including a single layer may not reflect as much as light generated from the active layer 123 and traveling towards the first electrode 150 and the second electrode 160, so that the amount of light absorbed by the first electrode 150 and the second electrode 160 increases, thereby deteriorating overall light extraction efficiency of the light emitting device.

Thus, the light emitting device according to this exemplary embodiment further includes the upper reflective layer 180 for enhancing reflectivity with respect to light traveling towards the first electrode 150 and the second electrode 160 by complementing the current blocking layer 130 including a single layer. The upper reflective layer 180 may include a DBR layer, which may include multiple layers including dielectric layers including a SiO2 layer, a TiO2 layer, a Nb2O5 layer, a ZrO2 layer, or a MgF2 layer. For example, the DBR layer may include multiple layers in which SiO2 layers and TiO2 layers are alternately stacked one above another. The DBR layer has a reflectance of 90% or more with respect to light having a wavelength of 400 nm to 700 nm, particularly light having a blue wavelength of 400 nm to 500 nm.

The first reflective layer 181 may be disposed between the first electrode 150 and the insulating layer 170. Specifically, the first reflective layer 181 may be disposed between the first electrode pad 151 and the insulating layer 170, and the first reflective layer 181 may be disposed between the first electrode extension 153 and the insulating layer 170.

Figure 6:
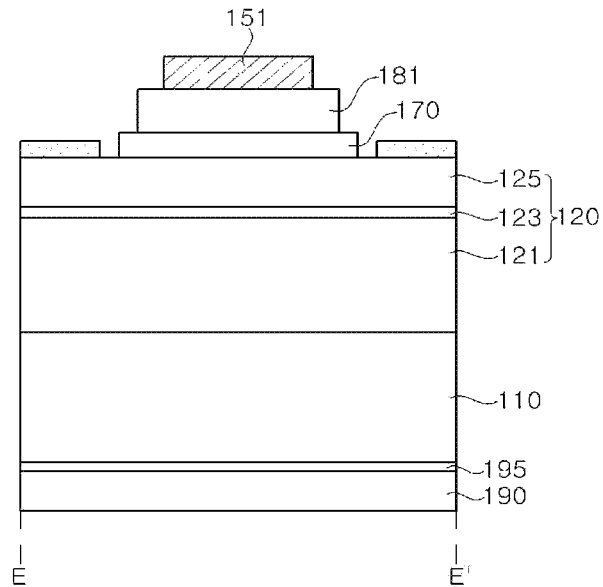
Figure 7A:
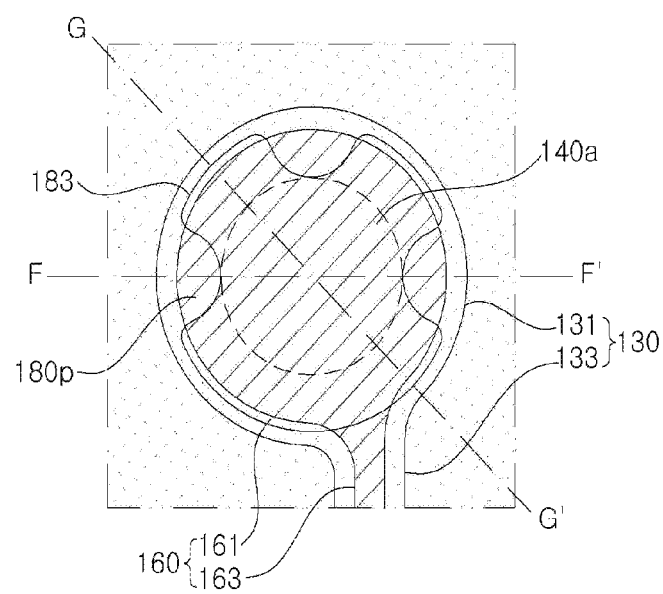
FIG. 7A is an enlarged plan view of Region α of FIG. 1 and FIG. 7B and FIG. 7C are cross-sectional views taken along lines F-F' and G-G' of FIG. 7A, respectively.
Figure 7B:
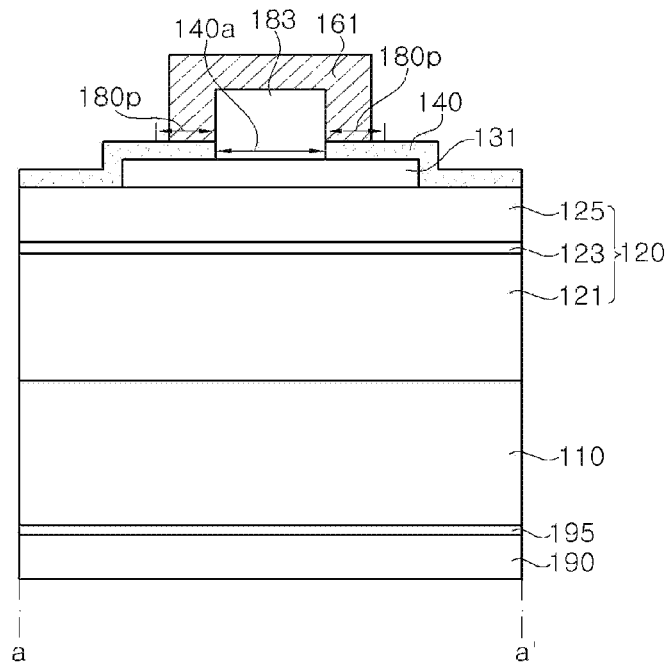
Figure 7C:
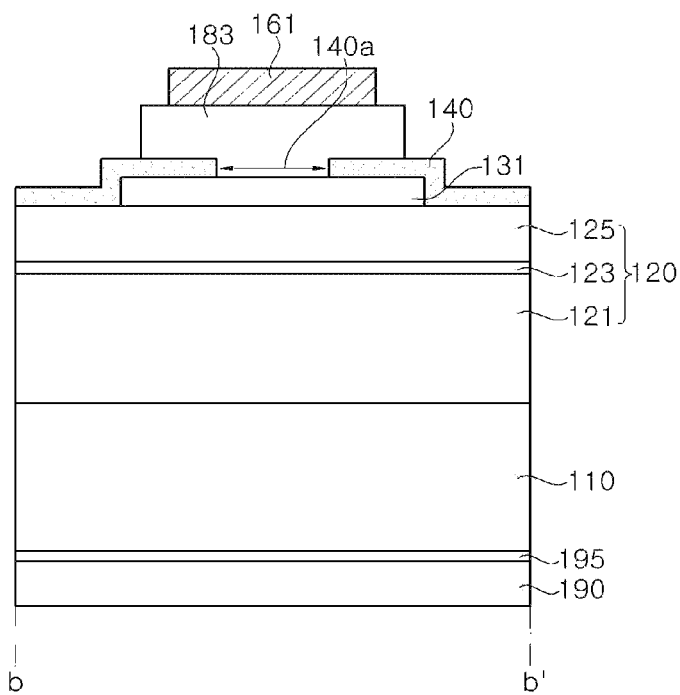

FIG. 6 is a cross-sectional view taken along line E-E' of FIG. 1. Next, relationships between the transparent electrode layer 140, the first electrode pad 151, the insulating layer 170 and the first reflective layer 181 will be described in more detail with reference to Referring to FIG. 6.

Referring to FIG. 6, the insulating layer 170 is disposed between the second conductivity-type semiconductor layer 125 and the first electrode pad 151. The insulating layer 170 under the first electrode pad 151 may have a larger area than the first electrode pad 151. In addition, the insulating layer 170 under the first electrode pad 151 may be spaced apart from the transparent electrode layer 140. With this structure, the light emitting device can prevent leakage current caused by defects in the insulating layer 170 and the first reflective layer 181 from flowing to the transparent electrode layer 140.

The first reflective layer 181 may be disposed between the insulating layer 170 and the first electrode pad 151, and may have an area smaller than the area of the insulating layer 170 and larger than the area of the first electrode pad 151. Since the first electrode pad 151 is formed on the second conductivity-type semiconductor layer 125, light generated from the active layer 123 under the first electrode pad 151 can be absorbed by the first electrode pad 151. Accordingly, the first reflective layer 181 can reflect light generated from the active layer 123 and traveling towards the first electrode pad 151 by supplementing the insulating layer 170 including a single layer and having low reflection efficiency. With this structure, the light emitting device can have improved power.

Referring again to FIG. 1, the first reflective layer 181 may be disposed between the insulating layer 170 and the first electrode extension 153. The first reflective layer 181 may be have a narrower width than the insulating layer 170 and thus may be placed in some regions on the insulating layer 170. In addition, the first reflective layer 181 has a greater width than the first electrode extension 153, whereby the first electrode extension 153 can be placed in some region on the first reflective layer 181.

As such, the first electrode pad 151 does not directly contact the first conductivity-type semiconductor layer 121 and the extension contact portion 153a of the first electrode extension 153 contacts the first conductivity-type semiconductor layer 121 to form electrical connection, thereby enabling efficient current spreading in the horizontal direction upon driving of the light emitting device. If the first electrode 150 is an n-type electrode, electrons are injected from the first electrode 150. In this case, when the entirety of the first electrode extension 153 contacts the first conductivity-type semiconductor layer 121, the density of electrons injected into the first conductivity-type semiconductor layer 121 can vary depending on distance from the first electrode pad 151. Accordingly, current spreading efficiency of the light emitting device can be deteriorated. According to this exemplary embodiment, the first electrode extension 153 contacts the first conductivity-type semiconductor layer 121 through the extension contact portion 153a thereof and the remaining portions of the first electrode extension 153 are insulated from the second conductivity-type semiconductor layer 125 by the insulating layer 170 and the first reflective layer 181. Thus, electrons are injected through the extension contact portion 153a, thereby maintaining a substantially constant electron injection density in the plural extension contact portions 153a. Accordingly, electrons can be efficiently injected through the first electrode extension 153, which is relatively distant from the first electrode pad 151, thereby improving current dispersion efficiency of the light emitting device.

The second reflective layer 183 is disposed corresponding to a portion of the transparent electrode layer 140 on which the current blocking layer 130 is disposed, after the transparent electrode layer 140 is formed. Although the second reflective layer 183 including a plurality of layers can be peeled off when exposed to high temperature during the RTA process for the transparent electrode layer 140, the second reflective layer 183 according to this exemplary embodiment is formed on the transparent electrode layer 140 after the RTA process for the transparent electrode layer 140, the second reflective layer 183 can be protected from high temperature upon the RTA process.

For example, the second reflective layer 183 may include a TiO2 layer vulnerable to high temperature. However, since the second reflective layer 183 is formed on the transparent electrode layer 140 after the RTA process for the transparent electrode layer 140, the risk of exposure of the second reflective layer 183 to the high temperature during the RTA process can be eliminated. Thus, the risk of crystallization of the TiO2 layer can also be eliminated, thereby preventing the risk of peeling off between multiple layers included in the second reflective layer 183.

Specifically, the second reflective layer 183 may be disposed in some region on the first current blocking layer 131 and the second current blocking layer 133 corresponding to the second electrode 160. The second reflective layer 183 disposed on the first current blocking layer 131 may be confined to some regions on the first current blocking layer 131. The shape of the second reflective layer 183 disposed on the first current blocking layer 131 will be described in detail with reference to FIG. 7.

The second reflective layer 183 disposed on the second current blocking layer 133 may have a smaller area than the second current blocking layer 133 and may be disposed in the form of dots separated from each other. The dots of the second reflective layer 183 may be arranged at constant intervals or different intervals. Specifically, the transparent electrode layer 140 is formed on the second current blocking layer 133 extending from the first side 101 towards the third side 103, and the second reflective layer 183 having a smaller area than the second current blocking layer 133 may be disposed in the form of dots separated from each other on the transparent electrode layer 140.

Figure 4:
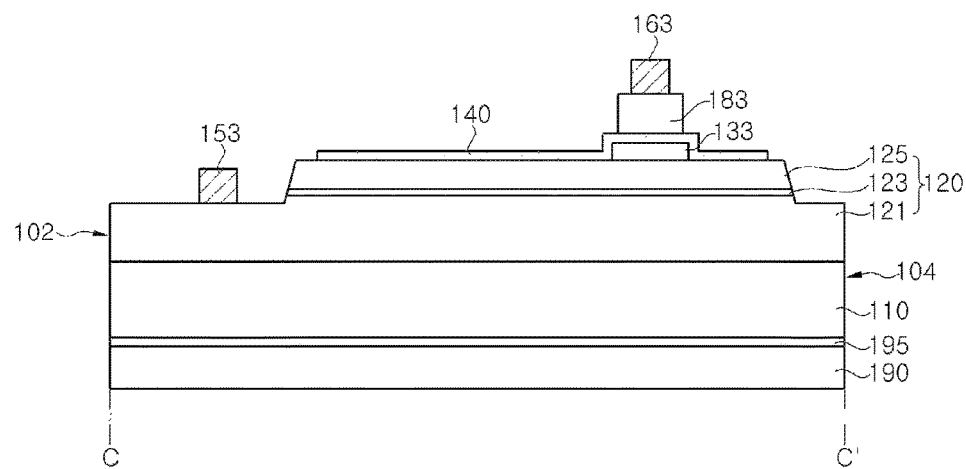
Figure 5:
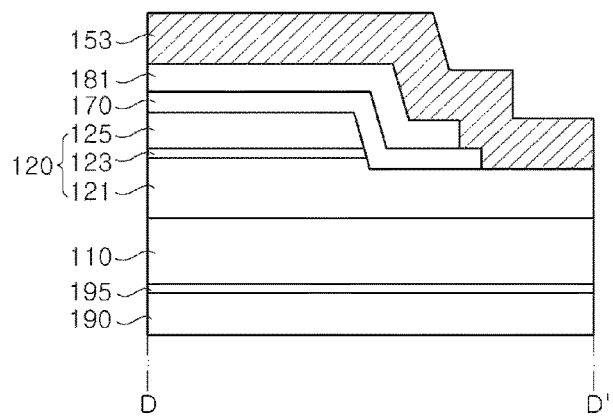

Referring to FIG. 1 and FIG. 4, since the second electrode extension 163 has a narrower width than the second reflective layer 183 disposed in the form of dots, the second electrode extension 163 is not directly connected to the transparent electrode layer 140 in regions in which the second reflective layer 183 is formed. On the contrary, referring to FIG. 1 and FIG. 3, in regions in which the second reflective layer 183 is not formed, the second electrode extension 163 may be connected to the transparent electrode layer 140 on the second current blocking layer 133. Since the transparent electrode layer 140 is connected to the second conductivity-type semiconductor layer 125, the second electrode extension 163 may be electrically connected to the second conductivity-type semiconductor layer 125 through the transparent electrode layer 140.

The arrangement of the dots of the second reflective layer 183 may correspond to the arrangement of the grooves 120g of the mesa 120m.

For example, referring to FIG. 1, the reflective layer 180 arranged in the form of dots separated from each other on the second current blocking layer 133 may be disposed on the grooves 120g of the mesa 120m and an imaginary line parallel to the first side 101 or the third side 103 of the light emitting device.

The first conductivity-type semiconductor layer 121 may be exposed through the grooves 120g of the mesa 120m, and the first electrode extension 153 may include the extension contact portion 153a forming ohmic contact with the first conductivity-type semiconductor layer 121 on the grooves 120g of the mesa 120m. In the grooves 120g of the mesa 120m, the first electrode extension 153 may be electrically connected to the first conductivity-type semiconductor layer 121 through the extension contact portion 153a.

Here, connection between the second electrode extension 163 and the transparent electrode layer 140 can be prevented by the reflective layer 180 arranged in the form of dots on the grooves 120g of the mesa 120m and the imaginary line parallel to the first side 101 or the third side 103.

Accordingly, a connecting portion between the first electrode extension 153 and the first conductivity-type semiconductor layer 121 and a connecting portion between the second electrode extension 163 and the transparent electrode layer 140 are alternately arranged, thereby enabling efficient current spreading in the horizontal direction. Herein, such alternate arrangement means that the connecting portion between the first electrode extension 153 disposed on the imaginary line parallel to the first side 101 or the third side 103 and the first conductivity-type semiconductor layer 121 and the connecting portion between the second electrode extension 163 and the transparent electrode layer 140 are not placed on the same line.

FIG. 7A is an enlarged plan view of Region α of FIG. 1 and FIG. 7B and FIG. 7C are cross-sectional views taken along lines F-F' and G-G' of FIG. 7A, respectively. Next, relationships between the first current blocking layer 131, the transparent electrode layer 140, the second electrode pad 161, the insulating layer 170 and the second reflective layer 183 will be described in more detail with reference to FIG. 7.

Referring to FIG. 7A, FIG. 7B and FIG. 7C, the first current blocking layer 131 may have a substantially circular shape in plan view. Alternatively, the first current blocking layer 131 may also have other shapes including a polygonal shape so as to be substantially similar to the shape of the second electrode pad 161 in plan view. The transparent electrode layer 140 may cover a side surface and a portion of an upper surface of the first current blocking layer 131. In some implementations, the transparent electrode layer 140 may cover a portion of the upper surface of the first current blocking layer 131 around an outer periphery of the first current blocking layer 131 and the transparent electrode layer 140 may not cover the first current blocking layer 131 around a central portion of the first current blocking layer 131.

The transparent electrode layer 140 may include the opening 140a. The opening 140a of the transparent electrode layer 140 may be disposed on the first current blocking layer 131. In this exemplary embodiment, the shape of the opening 140a may correspond to the shape of the outer periphery of the first current blocking layer 131. For example, in the structure wherein the first current blocking layer 131 has a circular shape, as shown in FIG. 7A, the transparent electrode layer 140 may be formed to cover a region around the circular periphery of the first current blocking layer 131 and the opening 140a may be formed in a circular shape. Here, it should be understood that the opening 140a is not limited thereto and may have various shapes.

The second reflective layer 183 corresponding to the second electrode pad 161 fills the opening 140a and may be formed in at least some regions on the transparent electrode layer 140, which cover the first current blocking layer 131 and the first current blocking layer 131. In addition, the light emitting device has the structure wherein the second electrode pad 161 is formed on the second reflective layer 183. The second reflective layer 183 and the second electrode pad 161 have a substantially similar shape in plan view. For example, referring to FIG. 7A, the second reflective layer 183 and the second electrode pad 161 have a circular shape. Here, the second reflective layer 183 may include at least one recess 180p indented into the circular shape. Since the second reflective layer 183 has a larger area than the second electrode pad 161 and the second electrode pad 161 is placed in some region on the second reflective layer 183, some regions under the second electrode pad 161 may be connected to the transparent electrode layer 140 through the recess 180p of the second reflective layer 183.

Referring to FIG. 7A, the second reflective layer 183 corresponding to the second electrode pad 161 includes three recesses 180p and the second electrode pad 161 may be electrically connected to the transparent electrode layer 140 through the three recesses 180p. Referring to FIG. 1 and FIG. 7A, electric current can be supplied into a region between the second electrode pad 161 and the first side 101 of the light emitting device through the recess 180p formed to face the first side 101, into a region between the second electrode pad 161 and the second side 102 of the light emitting device through the recess 180p formed to face the second side 102, and into a region between the second electrode pad 161 and the fourth side 104 of the light emitting device through the recess 180p formed to face the fourth side 104. In addition, electric current can be supplied into a region between the second electrode pad 161 and the third side through the second electrode extension 163. On the other hand, a contact area between a lower surface of the second electrode pad 161 and the transparent electrode layer 140 can be increased or decreased through adjustment of the area of the recesses 180p. The recesses 180p may have various shapes.

With the structure wherein only a small portion of the periphery of the lower surface of the second electrode pad 161 contacts the transparent electrode layer 140 through the recesses 180p, the second electrode pad 161 can be prevented from being peeled off. Furthermore, since this structure prevents direct connection between the second electrode pad 161 and the second conductivity-type semiconductor layer 125 through the transparent electrode layer 140, the light emitting device can prevent failure or damage due to static electricity, thereby providing high resistance to electrostatic discharge.

Contact resistance between the second electrode pad 161 and the second conductivity-type semiconductor layer 125 is higher than contact resistance between the transparent electrode layer 140 and the second conductivity-type semiconductor layer 125. Thus, when electric current is supplied through the second electrode pad 161, the electric current is likely to flow to the transparent electrode layer 140 having low resistance and thus can be effectively spread by the transparent electrode layer 140 in the horizontal direction. Furthermore, in this exemplary embodiment, since the second electrode pad 161 does not directly contact the second conductivity-type semiconductor layer 125, the light emitting device allows more efficient current spreading. The second reflective layer 183 may contact the first current blocking layer 131 by filling the opening 140a and may partially cover the transparent electrode layer 140 disposed on the first current blocking layer 131. The second electrode pad 161 may have a larger cross-sectional area than the opening 140a of the transparent electrode layer 140 in the horizontal direction.

An upper surface of the second electrode pad 161 may not be flat. Specifically, the upper surface of the second electrode pad 161 may have a surface profile corresponding to a surface profile formed by the upper surface of the transparent electrode layer 140 and the upper surface of the second reflective layer 183. For example, the second electrode pad 161 may be disposed on the transparent electrode layer 140 and the second reflective layer 183, which have uneven surface profiles, and thus may have a curved or stepped surface.

In this exemplary embodiment, the connecting portion between the first electrode extension 153 and the first conductivity-type semiconductor layer 121 through the extension contact portion 153a and the connecting portion between the second electrode extension 163 and the transparent electrode layer 140 on the second current blocking layer 133 without the second reflective layer 183 interposed therebetween are alternately arranged. Herein, such alternate arrangement means that the connecting portion between the first electrode extension 153 and the first conductivity-type semiconductor layer 121 and the connecting portion between the second electrode extension 163 and the transparent electrode layer 140 on the second current blocking layer 133 are not placed on the same line. With this structure, the light emitting device can secure efficient current spreading in the horizontal direction.

The lower reflective layer 190 may be disposed under a lower surface of the substrate 110. Herein, the lower surface of the substrate 110 means a surface opposite the surface of the substrate on which the light emitting structure 120 is placed.

The lower reflective layer 190 includes a metal layer and/or a DBR layer. The metal layer may include a metal having high reflectivity, for example, Al, Ag, Rh, Au, Cr, or Pt. The DBR layer may be composed of multiple layers including dielectric layers including a SiO2 layer, a TiO2 layer, a Nb2O5 layer, a ZrO2 layer, or a MgF2 layer. The DBR layer may be composed of multiple layers, for example, SiO2 layers and TiO2 layers, which are alternately stacked one above another. The DBR layer has a reflectance of 90% or more with respect to light having a wavelength of 400 nm to 700 nm, particularly light having a blue wavelength of 400 nm to 500 nm.

The lower reflective layer 190 can reflect light generated in the light emitting structure 120 and traveling towards the substrate 110, that is, the lower surface of the light emitting device. Particularly, in the structure wherein the substrate 110 is a transparent substrate such as a sapphire substrate, the lower reflective layer 190 can reflect light having passed through the substrate 110 to the upper surface of the light emitting device, which is a light exit surface thereof. With this structure, output of the light emitting device can be enhanced.

An interfacial layer 195 may be interposed between the substrate 110 and the lower reflective layer 190. The interfacial layer 195 may be the same dielectric layer as that used in the DBR layer, but is not limited thereto. The interfacial layer 195 may include, for example, SiO2 or MgF2.

The lower reflective layer 190 can be peeled off of the substrate 110 due to low adhesion between the lower reflective layer 190 and the substrate 110, for example, a sapphire substrate, and stress in the lower reflective layer 190. Thus, the interfacial layer 195 formed of or including an insulating material, such as SiO2 or MgF2, may be disposed between the lower reflective layer 190 and the substrate 110 in order to improve adhesion between the lower reflective layer 190 and the substrate 110.

On the other hand, when the wavelength of light generated from the light emitting structure 120 is indicated by $\lambda$, the physical thickness of the interfacial layer 195 can be represented by n·$\lambda$/4. Here, n indicates a positive integer.

The interfacial layer 195 formed of or including an insulating material can reduce output of the light emitting device by absorbing light generated from the light emitting structure 120. When the thickness of the interfacial layer 195 is represented by n·$\lambda$/4, the interfacial layer 195 can exhibit high light transmittance and thus can minimize light absorption by the interfacial layer 195. In the structure wherein the lower reflective layer 190 includes a DBR layer, the thickness of the interfacial layer 195 may be greater than the thickness of each of the layers included in the DBR layer.

Figure 9:
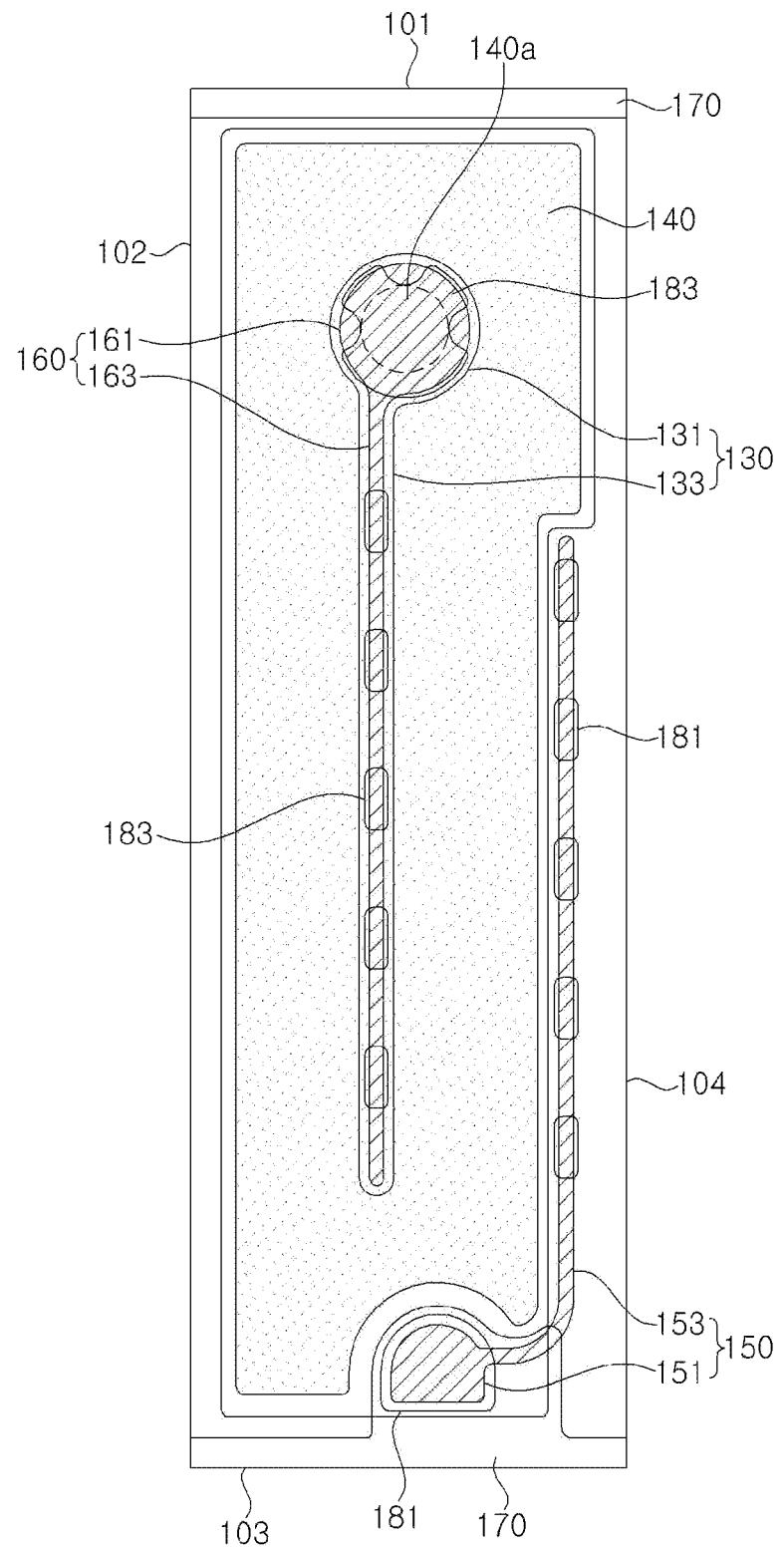
FIG. 9 is a plan view of an exemplary light emitting device according to another exemplary embodiment of the present document.

FIG. 9 is a plan view of a light emitting device according to another exemplary embodiment of the present document. The light emitting device shown in FIG. 9 is substantially similar to the light emitting device shown in FIG. 1 to FIG. 7. Hereinafter, the following description will focus on different features of the light emitting device as shown in FIG. 9 according to this exemplary embodiment and detailed descriptions of the same components will be omitted.

The light emitting device includes a light emitting structure 120, a current blocking layer 130, a transparent electrode layer 140, a first electrode 150, and a second electrode 160. In addition, the light emitting device may further include a substrate 110, an insulating layer 170, an upper reflective layer 180, and a lower reflective layer 190. In addition, the light emitting device may include first to fourth sides 101, 102, 103, 104.

According to this exemplary embodiment, the first electrode 150 includes a first electrode pad 151 and a first electrode extension 153. The first electrode pad 151 may be disposed on the second conductivity-type semiconductor layer 125 to be slightly offset from the center of the light emitting device towards the fourth side 104. In the light emitting device as shown in FIG. 9, the first electrode pad 151 may be disposed closer to the fourth side 104 than the second side 102. The insulating layer 170, which has a larger area than the first electrode pad 151, may be disposed between the first electrode pad 151 and the second conductivity-type semiconductor layer 125. The insulating layer 170 disposed under the first electrode pad 151 may extend to the fourth side 104 to cover a portion of a side surface of the light emitting structure 120 placed near the fourth side 104. In addition, the insulating layer 170 may extend towards the third side 103 to cover a portion of the side surface of the light emitting structure 120 placed near the third side 103 and at least part of the first conductivity-type semiconductor layer 121. As such, the structure of the insulating layer 170 extending to cover the side surface of the light emitting structure 120 can prevent electrical short circuit between the second conductivity-type semiconductor layer 125 and wires by wire bonding.

In addition, a first reflective layer 181 may be disposed between the first electrode pad 151 and the insulating layer 170. The first reflective layer 181 may have an area that is smaller than the area of insulating layer 170 and larger than the area of the first electrode pad 151. Thus, the first reflective layer 181 may be disposed in some region on the insulating layer 170 and the first electrode pad 151 may be disposed in some region on the first reflective layer 181. Since the first electrode pad 151 is disposed on the second conductivity-type semiconductor layer 125, light generated from the active layer 123 can be absorbed by the first electrode pad 151. Thus, the first reflective layer 181 can reflect light traveling towards the first electrode pad 151 by supplementing the insulating layer 170.

The first electrode extension 153 may be disposed on the first conductivity-type semiconductor layer. Unlike the exemplary embodiment shown in FIG. 1, in the light emitting device according to this exemplary embodiment, the mesa 120m does not include the groove 120g. Thus, the first electrode extension 153 may be disposed on the first conductivity-type semiconductor layer. Here, a portion of the first electrode extension 153 near the first electrode pad 151 may be disposed on the second conductivity-type semiconductor layer 125 such that the insulating layer 170 is interposed between the first electrode extension 153 and the second conductivity-type semiconductor layer 125. The insulating layer 170 can electrically insulate the second conductivity-type semiconductor layer 125 from the first electrode extension 153 thereon.

The first electrode extension 153 may extend from the first electrode pad 151 along a direction from the third side 103 towards the first side 101 that is parallel to the fourth side 104 of the light emitting device. The first reflective layer 181 may be interposed between the first electrode extension 153 and the first conductivity-type semiconductor layer 121. The first reflective layer 181 may be disposed in the form of dots between the first electrode extension 153 and the first conductivity-type semiconductor layer 121. The first reflective layer 181 may have a greater width than the first electrode extension 153, whereby the first electrode extension 153 cannot be connected to the first conductivity-type semiconductor layer 121 in regions in which the first reflective layer 181 is disposed. Alternatively, instead of the first reflective layer 181 composed of multiple layers, the insulating layer 170 composed of a single layer may be disposed between the first electrode extension 153 and the first conductivity-type semiconductor layer 121. Since the first electrode extension 153 is disposed on the first conductivity-type semiconductor layer 121 and the active layer 123 configured to generate light is not disposed under the first electrode extension 153, the first electrode extension 153 does not absorb a large amount of light.

Referring to FIG. 9, the second reflective layer 183 may be interposed in the form of dots between the second electrode extension 163 extending from the second electrode pad 161 and the second current blocking layer 133. The second reflective layer 183 may have a greater width than the second electrode extension 163, whereby the second electrode extension 163 cannot contact the transparent electrode layer 140 in a region in which the second reflective layer 183 is disposed.

The first reflective layer 181 or the insulating layer 170 disposed under the first electrode extension 153 and the second reflective layer 183 disposed under the second electrode extension 163 are alternately arranged with respect to an imaginary line parallel to the first side 101 or the third side 103 of the light emitting device. With such arrangement of the upper reflective layer 180, the light emitting device can achieve efficient lateral current spreading.

Figure 10:
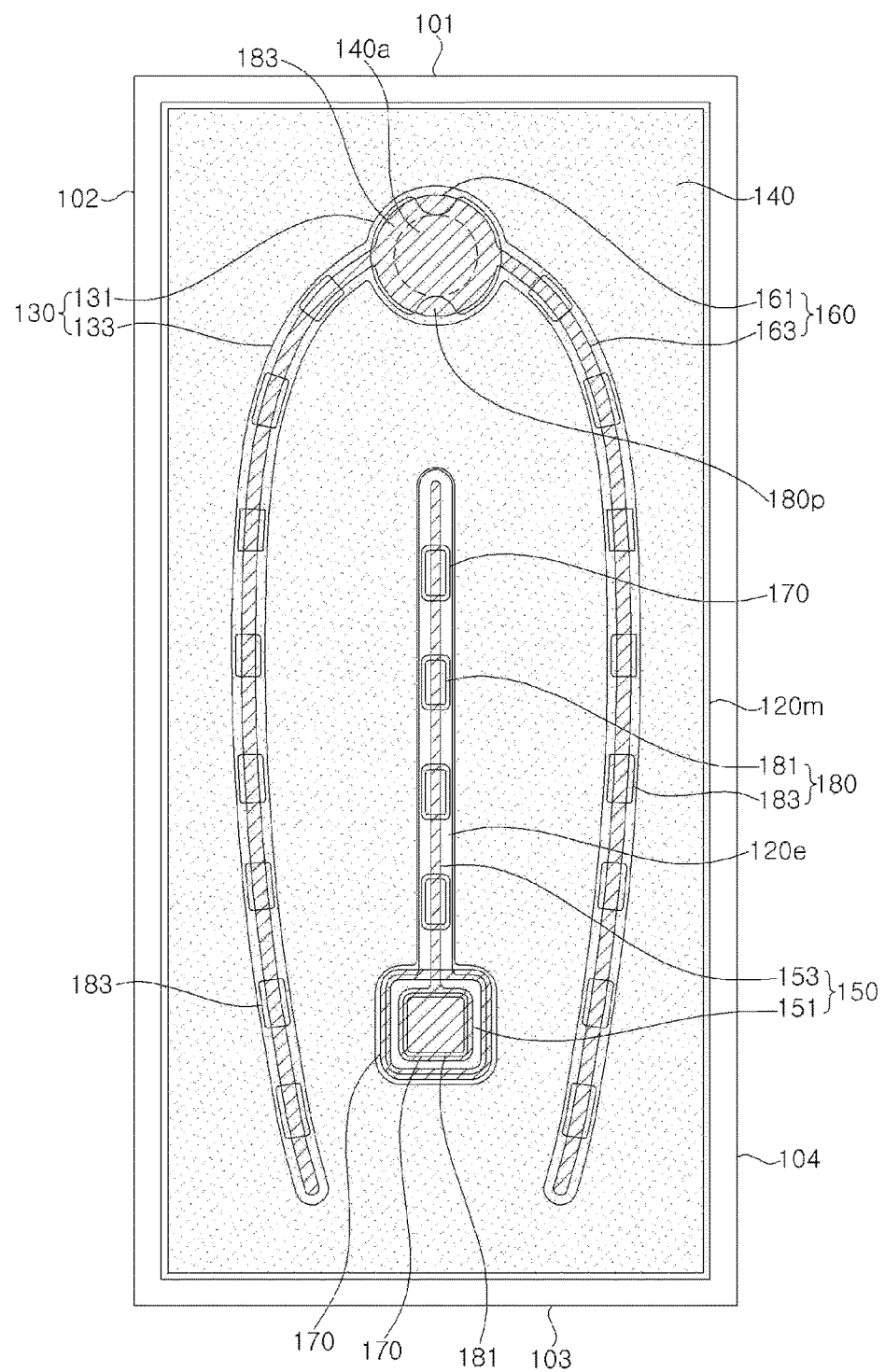
FIG. 10 is a plan view of an exemplary light emitting device according to a further exemplary embodiment of the present document.

FIG. 10 is a plan view of a light emitting device according to a further exemplary embodiment of the present document. The light emitting device shown in FIG. 10 is substantially similar to the light emitting device shown in FIG. 1 to FIG. 7. Hereinafter, the following description will focus on different features of the light emitting device according to this exemplary embodiment and detailed descriptions of the same components will be omitted.

The light emitting device includes a substrate 110, a light emitting structure 120, a first electrode 150, and a second electrode 160. In addition, the light emitting device may further include a current blocking layer 130, a transparent electrode layer 140, an insulating layer 170, an upper reflective layer 180, and a lower reflective layer 190. The light emitting device may have a substantially rectangular shape in plan view.

The light emitting structure 120 may include an exposed region 120e in which the first conductivity-type semiconductor layer 121 is exposed at least partially through the active layer 123 and the second conductivity-type semiconductor layer 125. The exposed region 120e exposes the first conductivity-type semiconductor layer 121 to provide a region in which the first electrode 150 can be electrically connected to the first conductivity-type semiconductor layer 121. Accordingly, the exposed region 120e may be formed at a location corresponding to the location of the first electrode 150 in consideration of the light emitting device. For example, as shown in FIG. 10, the exposed region 120e may extend from a portion near the third side 103 towards the first side 101.

The second electrode 160 includes a second electrode pad 161 and at least one second electrode extension 163 that may be disposed on the first current blocking layer 131 and the second current blocking layer 133, respectively. A transparent electrode layer 140 may be partially interposed between the second electrode 160 and the current blocking layer 130.

The second electrode pad 161 and the second electrode extension 163 may be modified in various ways in consideration of current spreading. In this exemplary embodiment, the second electrode pad 161 may be disposed near the first side 101 and two second electrode extensions 163 may extend from the first side 101 towards the third side 103. Here, each of the second electrode extensions 163 includes a curved portion. Particularly, each of the second electrode extensions 163 may include a portion in which the distance between the second electrode extension 163 and the second side 102 (or to the fourth side 104) decreases and a portion in which the distance therebetween increases, as the second electrode extensions 163 extend from the first side 101 towards the third side 103. The arrangement of the second electrode 160 is not limited thereto and may be modified in various ways depending upon the shape of the light emitting device.

A second reflective layer 183 may be disposed between the second electrode 160 and the transparent electrode layer 140 disposed on the current blocking layer 130. The second reflective layer 183 composed of a plurality of layers may supplement the current blocking layer 130 composed of a single layer to reflect light generated from the active layer 123 and traveling towards the second electrode 160. The second reflective layer 183 interposed between the second electrode pad 161 and the first current blocking layer 131 generally has a larger area than the second electrode pad 161. The second reflective layer 183 has recesses 180p in which the second electrode pad 161 contacts the transparent electrode layer 140. Referring to FIG. 10, the second reflective layer 183 disposed under the second electrode pad 161 includes two recesses 180p. The second electrode pad 161 may be connected to the transparent electrode layer 140 through the recesses 180p.

In addition, the second reflective layer 183 may be placed in some regions between the second electrode extensions 163 and the second current blocking layer 133. The second reflective layer 183 may be disposed in the form of dots separated from each other between the second electrode extensions 163 and the second current blocking layer 133. The second reflective layer 183 may have a greater width than the second electrode extensions 163, whereby the second electrode extensions 163 disposed on the second reflective layer 183 cannot be connected to the transparent electrode layer 140 disposed between the second reflective layer 183 and the second current blocking layer 133. That is, the second electrode extensions 163 cannot be directly connected to the transparent electrode layer 140 in regions in which the second reflective layer 183 is placed, and can be directly connected to the transparent electrode layer 140 in a region in which the second reflective layer 183 is not disposed.

The first electrode 150 may be disposed on the first conductivity-type semiconductor layer 121 and electrically connected to the first conductivity-type semiconductor layer 121. The first electrode 150 may be disposed on the exposed region 120e to form ohmic contact with the first conductivity-type semiconductor layer 121 and may be spaced apart from a side surface of the second conductivity-type semiconductor layer 125 and a side surface of the active layer 123.

The first electrode 150 may include a first electrode pad 151 and a first electrode extension 153. The first electrode pad 151 may be disposed near the third side 103. The insulating layer 170 may be disposed on a side surface of the light emitting structure 120 disposed near the first electrode pad 151 to surround the first electrode pad 151. The insulating layer 170 can prevent electrical connection between a wire and the side surface of the light emitting structure 120 upon wire bonding to the first electrode pad 151.

The insulating layer 170 and the first reflective layer 181 may be disposed in some regions between the first electrode pad 151 and the first conductivity-type semiconductor layer 121. The insulating layer 170 disposed between the first electrode pad 151 and the first conductivity-type semiconductor layer 121 has a smaller area than the first electrode pad 151. For example, the area of the insulating layer 170 may be 40% to 90% of the area of the first electrode pad 151. The insulating layer 170 disposed under the first electrode pad 151 makes efficient lateral current spreading. Here, if the insulating layer 170 has an excessively large area, for example, an area exceeding 90% of the area of the first electrode pad 151, forward voltage Vf of the light emitting device can increase. Thus, it may be desirable that the area of the insulating layer 170 be 90% or less of the area of the first electrode pad 151. The first reflective layer 181 may further be interposed between the insulating layer 170 and the first conductivity-type semiconductor layer 121. In this structure, the first reflective layer 181 may have a smaller area than the insulating layer 170.

The first electrode extension 153 may extend from the first electrode pad 151 at the third side 103 towards the first side 101. At least part of the first electrode extension 153 may be interposed between the second electrode extensions 163.

The insulating layer 170 may be disposed between the first electrode extension 153 and the first conductivity-type semiconductor layer 121. Referring to FIG. 10, the insulating layer 170 may be disposed in the form of dots between the first electrode extension 153 and the first conductivity-type semiconductor layer 121. The insulating layer 170 may have a greater width than the first electrode extension 153, whereby the first electrode extension 153 disposed on the insulating layer 170 cannot be directly connected to the first conductivity-type semiconductor layer 121. In addition, the first reflective layer 181, which has a width smaller than the width of the insulating layer 170 and greater than the width of the first conductivity-type semiconductor layer 121, may be disposed between the insulating layer 170 and the first conductivity-type semiconductor layer 121. In some exemplary embodiments, one of the insulating layer 170 and the first reflective layer 181 disposed under the first electrode 150 may be omitted.

Like the above exemplary embodiments, in the exemplary embodiment shown in FIG. 10, the first reflective layer 181 disposed under the first electrode extension 153 and/or the second reflective layer 183 disposed under the second electrode extensions 163 and the insulating layer 170 are alternately arranged. Referring to FIG. 10, assuming an imaginary line parallel to the first side 101 or the third side 103 of the light emitting device. Such alternate arrangement means that the first reflective layer 181 disposed under the first electrode extension 153 and/or the second reflective layer 183 disposed under the second electrode extensions 163 and the insulating layer 170 are not placed on the same line. The light emitting device can achieve efficient lateral current spreading through the structure wherein the upper reflective layer 180 (or current blocking layer) for blocking direct supply of electric current is alternately disposed under the first electrode extension 153 and the second electrode extension 163.

Figure 11:
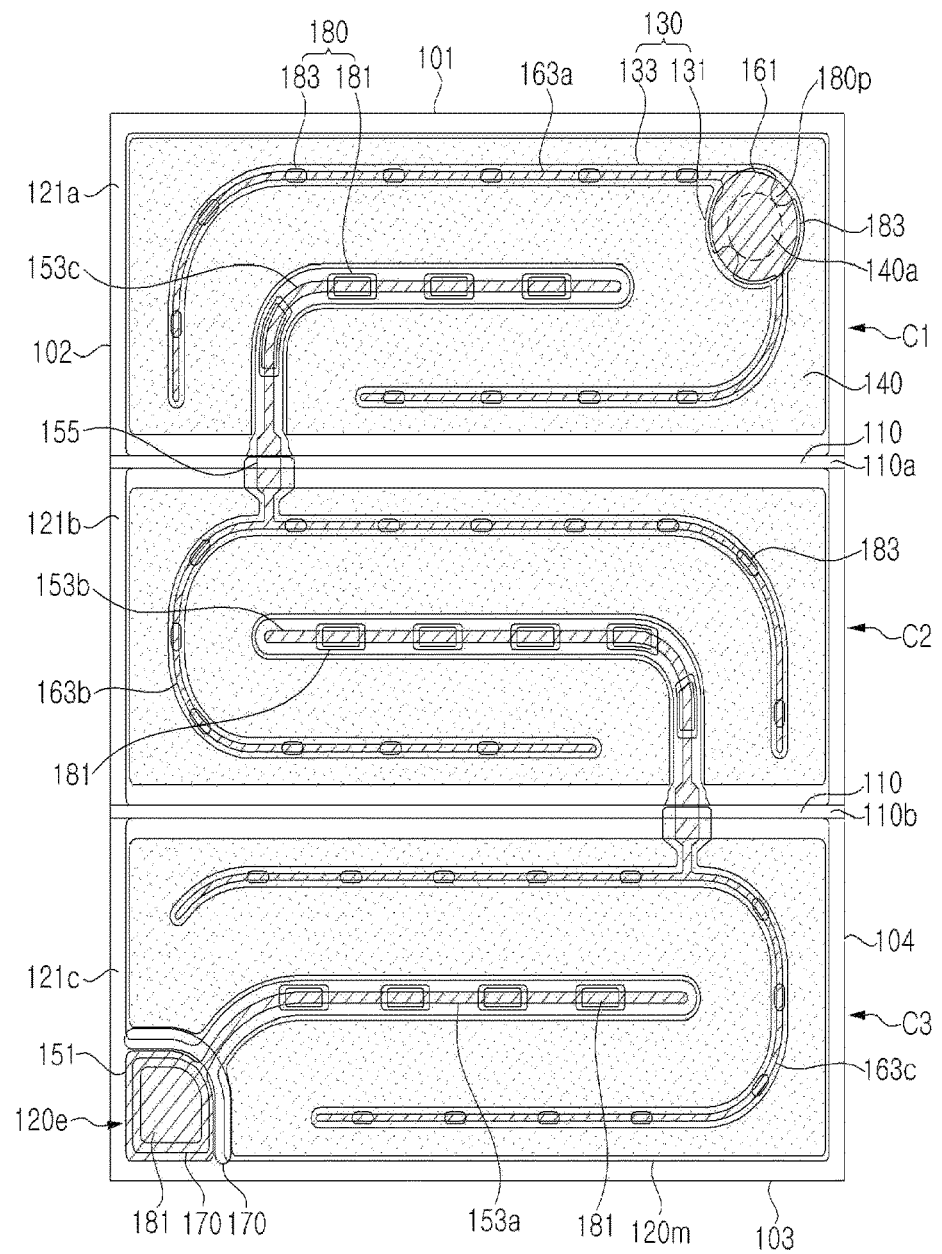
FIG. 11 is a plan view of an exemplary light emitting device according to yet another exemplary embodiment of the present document.

FIG. 11 is a plan view of a light emitting device according to yet another exemplary embodiment of the present document. The light emitting device shown in FIG. 11 is substantially similar to the light emitting device shown in FIG. 1 to FIG. 7. Hereinafter, the following description will focus on different features of the light emitting device according to this exemplary embodiment and detailed descriptions of the same components will be omitted.

The light emitting device includes a first light emitting cell C1, a second light emitting cell C2 and a third light emitting cell C3 disposed on a substrate 110. In addition, the light emitting device includes a first electrode pad 151, a second electrode pad 161, upper extensions 163a, 163b, 163c, lower extensions 153a, 153b, 153c, connecting portions 155, and a transparent electrode layer 140. The light emitting device may further include an insulating layer 170, an upper reflective layer 180, and a lower reflective layer 190.

The light emitting cells C1, C2, C3 may be isolated from each other by isolation trenches 110a, 110b. The isolation trenches 110a, 110b are formed by an isolation process and the substrate 110 is exposed through the isolation trenches 110a, 110b. Each of the light emitting cells C1, C2, C3 includes a first conductivity-type semiconductor layer 121a, 121b or 121c, an active layer 123, and a second conductivity-type semiconductor layer 125.

The second electrode pad 161 is disposed near one corner of the substrate 110 and the first electrode pad 151 is disposed near another corner of the substrate which is on an opposite side of the substrate to the co. The second electrode pad 161 is disposed on the second conductivity-type semiconductor layer 125 in the first light emitting cell C1, and the first electrode pad 151 is disposed on the first conductivity-type semiconductor layer 121 in an exposed region 120e in the third light emitting cell C3. In the exemplary device as shown in FIG. 11, the first electrode pad 151 is disposed at a left lower side of the third light emitting cell C3. As shown in FIG. 11, the second electrode pad 161 and the first electrode pad 151 may be disposed to face each other and are on the opposite sides of the substrate.

A second reflective layer 183 disposed between the second electrode pad 161 and the transparent electrode layer 140 partially disposed on the first current blocking layer 131 may have a larger area than the second electrode pad 161 and may include recesses 180*p*. As in the other exemplary embodiments, the second electrode pad 161 may be directly connected to the transparent electrode layer 140 through the recesses 180*p*. Referring to FIG. 11, the second reflective layer 183 may include two recesses 180*p* that are located to face each other. In some implementations, the two recesses 180*p* are symmetrically located with respect to a center of the second reflective layer 183. The recesses 180*p* are formed near one corner of the light emitting device.

The first electrode pad 151 may be disposed on the exposed region 120*e* and be connected to the first conductivity-type semiconductor layer 121. The insulating layer 170 and the first reflective layer 181 may be disposed in some regions between the first electrode pad 151 and the first conductivity-type semiconductor layer 121. For the same reason as described above with reference to FIG. 10, it may be desirable that the area of the insulating layer 170 be restricted to 90% or less of the area of the first electrode pad 151. The first reflective layer 181 having a smaller area than the insulating layer 170 is stacked on the insulating layer 170 to reduce absorption of light by the first electrode pad 151. In some exemplary embodiments, one of the insulating layer 170 and the first reflective layer 181 disposed under the first electrode 150 may be omitted.

In each of the light emitting cells, the first conductivity-type semiconductor layer 121*a*, 121*b*, 121*c* is exposed by etching the second conductivity-type semiconductor layer 125 and the active layer 123, and the lower extensions 153*a*, 153*b*, 153*c* are disposed on the exposed regions of the first conductivity-type semiconductor layers 121*a*, 121*b*, 121*c*, respectively. The lower extensions 153*a*, 153*b*, 153*c* are electrically connected to the first conductivity-type semiconductor layers 121*a*, 121*b*, 121*c*, respectively.

In the first and second light emitting cells C1, C2, each of the lower extensions 153*c*, 153*b* may include two linear regions (in the longitudinal or vertical directions) and a curved region connecting the linear regions to each other. One end of each of the lower extensions 153*c*, 153*b* is connected to the connecting portion 155 to be electrically connected to an upper extension 163*b* or 163*c* in another light emitting cell adjacent thereto in the vertical direction along which the light emitting cells C1, C2, C3 are arranged. The other end of each of the lower extensions 153*c*, 153*b* is located between portions of the corresponding upper extension 163*a* or 163*b*. In some implementations, each upper extension 163*a*, 163*b*, 163*c* include a curved portion and non-curved portions and the other end of each lower extensions is located to face the non-curved portion of teach upper extension1 163*a*, 163*b*. For example, the lower extension 153*c* of the first light emitting cell C1 is connected at one end thereof to the upper extension 163*b* of the second light emitting cell C2 through the connecting portion 155. With this structure, the first light emitting cell C1 may be electrically connected to the second light emitting cell C2 in series. The light emitting device can be operated at relatively high voltage using the light emitting cells C1, C2, C3 connected in series to one another, thereby lowering overall drive current thereof.

Referring to FIG. 11, the lower extension 153*c* of the first light emitting cell C1 extends from a left lower side of the first light emitting cell C1 in the vertical direction and is bent in the rightward direction, and the lower extension 153*b* of the second light emitting cell C2 extends from a right lower side of the second light emitting cell C2 in the vertical direction and is bent in the leftward direction.

The lower extension 153*a* is formed on the third light emitting cell C3 and connected to the first electrode pad 151.

The lower extension 153*a* includes a linear region and a curved region. The curved region connects the linear region of the lower extension 153*a* to the first electrode pad 151.

The insulating layer 170 and the first reflective layer 181 may be disposed under each of the lower extensions 153*a*, 153*b*, 153*c*. Each of the insulating layer 170 and the first reflective layer 181 may be formed in plural dots separated from one another. The insulating layer 170 may be disposed on the first conductivity-type semiconductor layer 121 and the first reflective layer 181 may be disposed between the insulating layer 170 and the lower extensions 153*a*, 153*b*, 153*c* to achieve efficient lateral spreading of electric current injected into the first conductivity-type semiconductor layers 121*a*, 121*b*, 121*c*. In some implementations, each of the insulating layer 170 and the first reflective layer 181 may have a greater width than the lower extensions 153*a*, 153*b*, 153*c*, whereby the lower extensions 153*a*, 153*b*, 153*c* disposed on the first reflective layer 181 may not be directly connected to the first conductivity-type semiconductor layer 121. In some exemplary embodiments, one of the insulating layer 170 and the first reflective layer 181 disposed under the lower extensions 153*a*, 153*b*, 153*c* may be omitted.

The upper extensions 163*a*, 163*b*, 163*c* are disposed on the second current blocking layer 133. The transparent electrode layer 140 is disposed between the second current blocking layer 133 and the upper extensions 163*a*, 163*b*, 163*c*. The upper extension 163*a* extends from the second electrode pad 161 located near the fourth side 104 of the light emitting device towards the second side 102 of the light emitting device along the longitudinal direction of the first light emitting cell C1. Referring to FIG. 11, the upper extension 163*a* includes two ends which are disposed on both sides of the lower extension 153*c*. The upper extension 163*a* is disposed to be spaced apart from the lower extension 153*c* and has a shape to surround the lower extension 153*c* including one end and a portion of a side surface of the lower extension 153*c*. Accordingly, one part of the upper extension 163*a* is disposed above the lower extension 153*c* and the other part of the upper extension 163*a* is disposed below the lower extension 153*c*. As shown in FIG. 11, the part of the upper extension 163*a* disposed above the lower extension 153*c* is longer than the other part of the upper extension 163*a* disposed below the lower extension 153*c*, and the upper extension 163*a* may be rounded along the curved region of the lower extension 153*c*. The upper extension 163*b* is disposed on the second light emitting cell C2 and extends from the second side 102 of the light emitting device towards the fourth side 104 in the longitudinal direction. The upper extension 163*c* disposed on the third light emitting cell has a substantially similar shape to the upper extension 163*b* disposed on second light emitting cell C2 and exhibits mirror symmetry with respect to the isolation trench 110*b* between the light emitting cells C2 and C3.

The second current blocking layer 133 may have a greater width than the upper extensions 163*a*, 163*b*, 163*c*. In addition, the second reflective layer 183 may be disposed under each of the upper extensions 163*a*, 163*b*, 163*c*. The second reflective layer 183 may be disposed in the form of dots separated from one another between the upper extensions 163*a*, 163*b*, 163*c* and the transparent electrode layer 140 on the second current blocking layer 133. The second reflective layer 183 may have a greater width than each of the upper extensions 163*a*, 163*b*, 163*c*, whereby the upper extensions 163*a*, 163*b*, 163*c* can be directly connected to the transparent electrode layer 140 in regions in which the second reflective layer 183 is disposed.

In the exemplary embodiment shown in FIG. 11, the second reflective layer 183 disposed under the upper extensions 163a, 163b, 163c and the first reflective layer 181 and/or the insulating layer 170 disposed under the lower extensions 153a, 153b, 153c are alternately arranged. Referring to FIG. 11, assuming an imaginary line parallel to the second side 102 or the fourth side 104 of the light emitting device. Such alternate arrangement means that the second reflective layer 183 disposed under the upper extensions 163a, 163b, 163c and the first reflective layer 181 and/or the insulating layer 170 disposed under the lower extensions 153a, 153b, 153c are not placed on the same line. The light emitting device can achieve efficient lateral current spreading through the structure wherein the upper reflective layer 180 (or current blocking layer) for blocking direct supply of electric current is alternately disposed under the upper extensions 163a, 163b, 163c and the lower extensions 153a, 153b, 153c.

Figure 12:
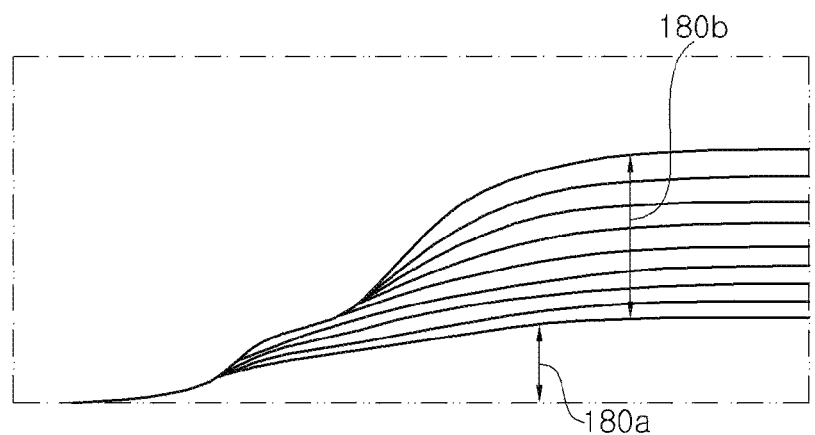
FIG. 12 is a partially enlarged cross-sectional view of an exemplary reflective layer according to embodiments described in the present document.

FIG. 12 is a partially enlarged cross-sectional view of a reflective layer 180 according to other exemplary embodiments described in the present document.

Unlike the current blocking layer 130 and the insulating layer 170, each composed of a single layer as described above, the upper reflective layer 180 may be composed of multiple layers. For example, the upper reflective layer 180 may have a stacked structure in which SiO2 layers and TiO2 layers are alternately stacked one above another.

Referring to FIG. 12, the upper reflective layer 180 may have a stacked structure of multiple layers. For example, the upper reflective layer 180 includes a SiO2 disposed at the lowermost side thereof and TiO2 layers and SiO2 that are sequentially stacked one above another. Here, the SiO2 layer at the lowermost side of the upper reflective layer 180 may be referred to as a first region 180a of the upper reflective layer 180 and the remaining portion of the upper reflective layer 180 may be referred to as a second region 180b of the upper reflective layer 180. In some implementations, the second region 180b of the upper reflective layer includes the stacked structure of TiO2 layers and SiO2 layers stacked on the first region 180a. The SiO2 layer of the first region 180a may have a greater thickness than the SiO2 layer of the second region 180b, but is not limited thereto.

The first region 180a may have a shape that is convex at the center thereof and has a thickness gradually decreasing from the center thereof to an outer periphery at opposite sides thereof. The center of the first region 180a may have an optical thickness of 7/4*λ, wherein λ indicates the wavelength of light generated in the light emitting device, that is, in the active layer 123. Thus, when light generated in the light emitting device has a wavelength of 450 nm, the center of the first region 180a may have an actual thickness (7/4n*λ, n being the index of refraction of the first region) of about 500 nm or more. The outer periphery of the first region 180a may have an inclination of about 10 degrees with respect to a lower surface thereof.

The first region 180a may be formed by forming a photoresist pattern, followed by e-beam evaporation. In this case, layers under the upper reflective layer 180 can be damaged during e-beam evaporation. Thus, in order to prevent damage to the layers under the upper reflective layer 180, the first region 180a may be formed by first performing e-beam evaporation through low-energy ion assisted deposition (IAD). Alternatively, for formation of the first region 180a, after a SiO2 layer is first formed through HDCVD, a SiO2 layer is formed to a sufficient thickness to protect the layers under the upper reflective layer 180 through HDCVD and then the remaining portion of the first region 180a is formed by e-beam evaporation.

The photoresist pattern may be formed to have an inversely inclined open region such that the thickness of the first region 180a gradually decreases from the center of the first region 180a to the outer periphery thereof. Accordingly, the outer periphery of the first region 180a may have an inclination of about 10 degrees with respect to the lower surface thereof.

The first region 180a has a greater thickness than each layer of the second region 180b, thereby preventing damage to the layers under the first region 180a by electron beams when each layer of the second region 180b is formed through e-beam evaporation.

The second region 180b is disposed on the first region 180a and includes a plurality of layers. In the structure wherein the first region 180a is a SiO2 layer, the second region 180b has a structure wherein TiO2 layers and SiO2 layers are sequentially stacked on the first region 180 and the TiO2 layer is provided as a start layer. For example, in the structure wherein the upper reflective layer 180 includes a total of 17 layers, the second region 180b may include 16 layers in which a TiO2 layer is provided as a start layer and a SiO2 layer is provided as the last layer. Each layer in the second region 180b may have a thickness of about ¼*λ, wherein λ indicates the wavelength of light generated in the light emitting device. That is, each layer in the second region 180b has a smaller thickness than the first region 181a. Each layer in the second region 180b may be formed by e-beam evaporation, in which the energy used in IAD may be adjusted to be higher than the energy used in formation of the first region 180a to provide good quality to the layers in the second region 180b. This can be achieved since the first region 180a having a relatively thick thickness can prevent damage to the layers under the first region 180a by electron beams.

In some exemplary embodiments, the light emitting device may further include a passivation layer (not shown) covering at least part of the surface thereof. The passivation layer can protect the light emitting device from external moisture or toxic gas. The passivation layer may be formed of or include an insulating material and may be composed of a single layer or multiple layers. For example, the passivation layer may include SiO2, MgF2, SiN, or others, or may include a distributed Bragg reflector in which different material layers such as TiO2 and SiO2 are alternately stacked one above another. Further, in the structure wherein the passivation layer is composed of multiple layers, the uppermost layer may be formed of or include SiN, which has high moisture resistance to provide effective protection to the light emitting device against external moisture.

Although some exemplary embodiments have been described herein, it should be understood that various modifications, changes, alterations, and equivalent embodiments can be made by those skilled in the art without departing from the spirit and scope of the present document.

What is claimed is:

1. A light emitting device comprising:
    a first conductivity-type semiconductor layer;
    a second conductivity-type semiconductor layer;
    an active layer interposed between the first conductivity-type semiconductor layer and the second conductivity-type semiconductor layer;
    a current blocking layer disposed on the second conductivity-type semiconductor layer;
    a transparent electrode layer covering the current blocking layer;

a first electrode electrically connected to the first conductivity-type semiconductor layer;
a second electrode disposed on the transparent electrode layer and electrically connected to the transparent electrode layer, the second electrode comprising a second electrode pad and a second electrode extension extending from the second electrode pad; and an insulating layer disposed under the first electrode; and a first reflective layer interposed between the first electrode and the insulting layer;
a second reflective layer interposed between the second electrode and the transparent electrode layer and having a curved shape,
wherein each of the second electrode pad and the second electrode extension covers at least part of the current blocking layer; and
wherein the second reflective layer includes at least one recess indented into the curved shape.

2. The light emitting device according to claim 1, wherein the second reflective layer comprises dielectric layers having different indices of refraction.

3. The light emitting device according to claim 1, wherein the second electrode is confined within an upper region of the current blocking layer.

4. The light emitting device according to claim 1, wherein the current blocking layer comprises a first current blocking layer corresponding to the second electrode pad and a second current blocking layer corresponding to the second electrode extension.

5. The light emitting device according to claim 4, wherein the second reflective layer comprises a reflective layer interposed between the second electrode pad and the first current blocking layer.

6. The light emitting device according to claim 1, wherein the recess is placed in an upper region of the current blocking layer and at least part of a lower surface of the second electrode pad is connected to the transparent electrode layer through the recess of the second reflective layer.

7. The light emitting device according to claim 4, wherein the second reflective layer comprises a reflective layer disposed in the form of dots between the second electrode extension and the transparent electrode layer, the reflective layer having a greater width than the second electrode extension.

8. The light emitting device according to claim 7, wherein the reflective layer is confined within an upper region of the current blocking layer.

9. The light emitting device according to claim 1, wherein the first electrode comprises a first electrode pad and a first electrode extension extending from the first electrode pad,
the first electrode pad being disposed above the second conductivity-type semiconductor layer, and
the insulating layer insulates the first electrode pad from the second conductivity-type semiconductor layer.

10. The light emitting device according to claim 9, wherein the first reflective layer comprises a reflective layer disposed between the first electrode pad and the second conductivity-type semiconductor layer, the reflective layer having an area smaller than the insulating layer and larger than the first electrode pad.

11. The light emitting device according to claim 10, wherein the first reflective layer comprises a reflective layer disposed in the form of dots under the first electrode extension, the reflective layer having a greater width than the first electrode extension.

12. The light emitting device according to claim 11, wherein the second reflective layer comprises a reflective layer disposed in the form of dots between the second electrode extension and the transparent electrode layer, the reflective layer having a greater width than the second electrode extension, and the dots of the second reflective layer and the dots of the first reflective layer are alternately arranged.

13. The light emitting device according to claim 1, wherein the first electrode comprises a first electrode pad and a first electrode extension extending from the first electrode pad,
the first electrode pad being disposed above the first conductivity-type semiconductor layer, and
the insulating layer has a smaller area than the first electrode pad and is disposed in some region between the first electrode pad and the first conductivity-type semiconductor layer.

14. The light emitting device according to claim 13, wherein an area of the insulating layer interposed between the first electrode pad and the first conductivity-type semiconductor layer is less than 90% of an area of the first electrode pad.

15. The light emitting device according to claim 1, wherein the active layer and the second conductivity-type semiconductor layer are structured to provide a mesa,
wherein the mesa comprises at least one groove formed on a side surface thereof such that the first conductivity-type semiconductor layer is partially exposed through the groove, the insulating layer comprises an opening at least partially exposing the exposed first conductivity-type semiconductor layer, and the first electrode extension is connected to the first conductivity-type semiconductor layer through the opening.

16. The light emitting device according to claim 15, wherein the second reflective layer comprises a reflective layer disposed in the form of dots between the second electrode extension and the transparent electrode layer, the reflective layer having a greater width than the second electrode extension, and
the dots of the second reflective layer and the at least one groove of the mesa are alternately arranged.

17. The light emitting device according to claim 1, wherein the current blocking layer includes a single layer and the second reflective layer comprises a plurality of layers having different indices of refraction.

18. The light emitting device according to claim 17, wherein the second reflective layer comprises a first region and a second region,
the first region formed with a single layer placed at a lowermost side of the second reflective layer,
the second region comprising a plurality of layers placed on the first region.

19. The light emitting device according to claim 18, wherein the first region has a thickness of $7/(4*n_1)*\lambda$ and each of the layers in the second region has a thickness of $1/(4*n_2)*\lambda$ ($\lambda$ is the wavelength of light generated from the active layer, $n_1$ is the index of refraction of the first region, and $n_2$ is the index of refraction of each of the layers in the second region).

* * * * *